(12) United States Patent
Yamashita et al.

(10) Patent No.: US 7,209,798 B2
(45) Date of Patent: Apr. 24, 2007

(54) ISO/NESTED CASCADING TRIM CONTROL WITH MODEL FEEDBACK UPDATES

(75) Inventors: Asao Yamashita, Wappingers Falls, NY (US); Merritt Lane Funk, Austin, TX (US); Daniel Prager, Hopewell Junction, NY (US)

(73) Assignee: Tokyo Electron Limited, Tokyo (JP)

( * ) Notice: Subject to any disclaimer, the term of this patent is extended or adjusted under 35 U.S.C. 154(b) by 192 days.

(21) Appl. No.: 10/944,463

(22) Filed: Sep. 20, 2004

(65) Prior Publication Data

US 2006/0064193 A1  Mar. 23, 2006

(51) Int. Cl.
*G06F 19/00* (2006.01)
(52) U.S. Cl. .................. 700/121; 738/714
(58) Field of Classification Search ......... 700/121, 700/97; 438/714, 706; 716/101
See application file for complete search history.

(56) References Cited

U.S. PATENT DOCUMENTS

| | | | |
|---|---|---|---|
| 5,946,079 A * | 8/1999 | Borodovsky | 355/67 |
| 6,297,166 B1 | 10/2001 | Horak et al. | |
| 6,884,734 B2 * | 4/2005 | Buehrer et al. | 438/723 |
| 2001/0031506 A1 | 10/2001 | Plat et al. | |
| 2003/0228532 A1 | 12/2003 | Mui et al. | |
| 2004/0185583 A1 * | 9/2004 | Tomoyasu et al. | 438/8 |

OTHER PUBLICATIONS

M. Nagase et al., "Accurate Gate CD Control for 130nm CMOS Technology Node," Conf. Proc., 2003 IEEE Int'l Symp. Semiconductor Manufacturing, pp. 183-186, (Sep. 30, 2003).
Masatoshi Nagase et al., "Advanced Gate Etching for Accurate CD Control for 130-nm Node ASIC Manufacturing," IEEE Transactions on Semiconductor Manufacturing, vol. 17 (No. 3), pp. 281-285, (Aug. 2004).
Wesley C. Natzle et al., "Trimming of Hard-masks by Gaseous Chemical Oxide Removal (COR) for Sub-10nm Gates/Fins, for Gate Length Control and for Embedded Logic," ASMC '04, IEEE Conference and Workshop, p. 61-65, (May 4, 2004).
Mitsugu Tajima et al., "Advanced Process Control for 40nm Gate Fabrication," Conf. Proc., IEEE Int'l Symp. Semiconductor Manufacturing, p. 115-118, (Sep. 30, 2003).

* cited by examiner

*Primary Examiner*—Kidest Bahta
(74) *Attorney, Agent, or Firm*—Pillsbury Winthrop Shaw Pittman LLP

(57) ABSTRACT

This method includes a method for etch processing that allows the bias between isolated and nested structures/features to be adjusted, correcting for a process wherein the isolated structures/features need to be smaller than the nested structures/features and wherein the nested structures/features need to be reduced relative to the isolated structures/features, while allowing for the critical control of trimming.

36 Claims, 20 Drawing Sheets

CENTER PROFILE

AR165 :

AR40 : 71nm

TEOS : 40nm

BARC     BARC+TRIM15S

EDGE PROFILE

AR165 :

AR40 : 70nm

TEOS : 41nm

ISO/NESTED CASCADING TRIM CONTROL WITH MODEL FEEDBACK UPDATES

FIELD OF THE INVENTION

The invention relates to semiconductor wafer processing. More particularly, the invention relates to processing a wafer having isolated and nested structures.

BACKGROUND OF THE INVENTION

The use of feedforward controllers in semiconductor processing has long been established in the fabrication of semiconductor integrated circuits by semiconductor manufacturing facilities (fabs). Until recently, wafers were treated as a batch or a lot and the same processing was performed on each of the wafers in the lot. The size of the lot varies depending on the manufacturing practices of the fab but is typically limited to a maximum of 25 wafers. Measurements were routinely made on a few wafers in the lot and adjustments made to the processing based on these sample measurements. This method of control based on sample measurements on the lot and process recipe adjustments for the following lots is called lot-to-lot control (L2L). The process models and information necessary to modify the process recipes for L2L control were kept and the computations were performed at the fab level. Recently manufacturers of semiconductor processing equipment (SPE) have included the ability to measure each wafer immediately before and after the processing is performed. The capability to measure each wafer on the processing tool is called integrated metrology (IM). IM enabled the ability to measure and adjust the process recipe at the wafer-to-wafer (W2W) level.

The structures on the semiconductor wafers have not only decreased in size but also have increased in density causing additional processing control problems. Areas on semiconductor wafers have been identified as being isolated areas or nested areas based on the density of structures within the particular area and problems have developed in the semiconductor processing due to these different densities.

The need for trim etch has become common, with many methods being developed for trimming the Critical Dimension (CD) for gate length control. Iso/nested control has become part of the mask design process, including the modeling of the process through the etcher. The iso/nested model designed into the mask making process however is optimized for a single CD target related to an isolated or nested structure. As the need to shrink the gate by trimming and the need to change gate targets change over time, it is expensive to create new masks and re-optimize the iso/nested bias. The mask bias control is by use of the optical and process correction (OPC), sometimes called optical proximity correction, in which the apertures of the reticle are adjusted to add or subtract the necessary light to increase pattern fidelity. Another approach is phase-shift masks (PSM), in which topographic structures are created on the reticle to introduce contrast-enhancing interference fringes in the image. Another problem can occur when designers learn after the mask is made that the iso/nested bias requires adjusting to optimize performance after the mask is generated and the first setup sample parts are created.

What has not been addressed is a method to adjust the wafer CD bias between isolated and nested lines after pattering as part of the etch process.

SUMMARY OF THE INVENTION

This method includes a method for etch processing that allows the bias between isolated and nested structures/features to be adjusted, correcting for a process wherein the isolated structures/features need to be smaller than the nested structures/features and wherein the nested structures/features need to be reduced relative to the isolated structures/features, while allowing for the critical control of trimming.

Another novel method is the application of the process in controlling the system that decouples the process in a cascading sequence of steps that includes the iso/nested bias control and trim control, and then provides a method of updating the process model using feedback. A third method is including in the calibration of the measurements used for feed forward and feedback control.

The invention allows the factory system to change the bias target amount and final CD amount on a lot-to-lot or wafer-to-wafer frequency using TEL's TELIUS poly gate process with integrated metrology and integrated Automated Process Control (APC) control system.

BRIEF DESCRIPTION OF THE DRAWINGS

A more complete appreciation of various embodiments of the invention and many of the attendant advantages thereof will become readily apparent with reference to the following detailed description, particularly when considered in conjunction with the accompanying drawings, in which:

FIG. 17 illustrates an exemplary view of an Iso/Nested Control Strategy Screen in accordance with an embodiment of the invention;

FIG. 18 illustrates an exemplary view of a Nested Control Plan Editor Screen in accordance with an embodiment of the invention;

FIG. 19 illustrates an exemplary view of a Isolated Control Plan Editor Screen in accordance with an embodiment of the invention; and FIG. 20 illustrates an exemplary view of a Formula Model Editor Screen in accordance with an embodiment of the invention.

DETAILED DESCRIPTION OF SEVERAL EMBODIMENTS

Figure 1:
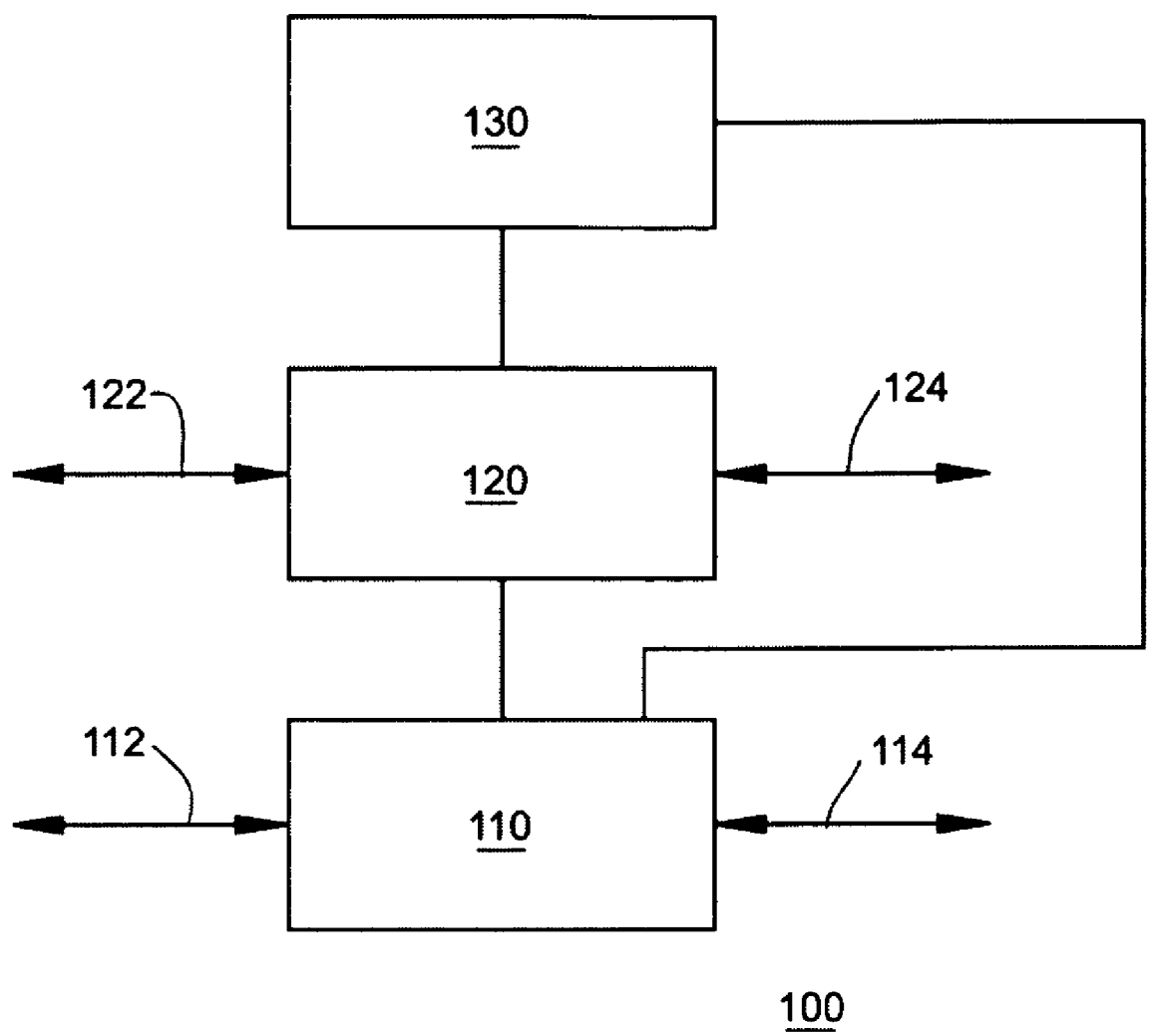
FIG. 1 shows an exemplary block diagram of a processing system in accordance with an embodiment of the present invention.

Various embodiments of the present invention are discussed below. Where appropriate, like reference numerals are used to refer to like features. The embodiments presented herein are intended to be merely exemplary of the wide variety of embodiments contemplated within the scope of the present invention, as would be appreciated by those skilled in the art. Accordingly, the invention is not limited solely to the embodiments presented but also encompasses any and all variations and equivalents that would be appreciated by those skilled in the art.

FIG. 1 shows an exemplary block diagram of a processing system in accordance with an embodiment of the present invention. In the illustrated embodiment, a processing system 100 comprises a processing tool 110, a controller 120 coupled to the processing tool 110, and a manufacturing equipment system (MES) 130 (also referred to as "the factory system 130") coupled to the controller 120. In addition, at least one of the processing tool 110, the controller 120, and the MES 130 can comprise a Graphical User Interface ("GUI") component and/or a database component (not shown). As should be appreciated by those skilled in the art, in alternate embodiments and variations, the GUI component and/or the database component need not be employed to practice the present invention and its variations.

Some setup and/or configuration information can be obtained by the processing tool 110 and/or the controller 120 from the factory system 130. Factory level business rules can be used to establish a control hierarchy. For example, the processing tool 110 and/or the controller 120 can operate independently, or can be controlled to some degree by the factory system 130. In addition, factory level business rules can be used to determine when a process is paused and/or stopped, and what is done when a process is paused and/or stopped. In addition, factory level business rules can be used to determine when to change a process and how to change the process.

Business rules can be used to specify the action taken for normal processing and the actions taken on exceptional conditions. The actions can include: initial model loading, pre-etch metrology data filtering, controller recipe selection, post-etch metrology data filtering, feedback calculation, and model update, to list but a few such examples.

Business rules can be defined at a control strategy level, a control plan level, or a control model level, among others. Business rules can be assigned to be executed whenever a particular context is encountered. When a matching context is encountered at a higher level as well as a lower level, the business rules associated with the higher level can be executed. GUI screens can be used for defining and maintaining the business rules. Business rule definition and assignment can be allowed for users with greater than normal security level. The business rules can be maintained in the database. Documentation and help screens can be provided on how to define, assign, and maintain the business rules.

The MES 130 can monitor some system processes using data reported from the databases associated with the processing tool 110 and/or the controller 120. Factory level business rules can be used to determine which processes are monitored and which data is used. For example, the processing tool 110 and/or the controller 120 can independently collect data, or the data collection process can be controlled to some degree by the factory system 130. In addition, factory level business rules can be used to determine how to manage the data when a process is changed, paused, and/or stopped.

In addition, the MES 130 can provide run-time configuration information to the processing tool 110 and/or the controller 120. For example, automated process control (APC) settings, targets, limits, rules, and algorithms can be downloaded from the factory to the processing tool 110 and/or the controller 120 as an "APC recipe", an "APC system rule", and "APC recipe parameters" at run-time.

Some setup and/or configuration information can be determined by the processing tool 110 and/or the controller 120 when they are initially configured by the system. System level business rules (system rules) can be used to establish a control hierarchy. For example, the processing tool 110 and/or the controller 120 can operate independently, or the processing tool 110 can be controlled to some degree by the controller 120. In addition, system rules can be used to determine when a process is paused and/or stopped, and what is done when a process is paused and/or stopped. In addition, system rules can be used to determine when to change a process and how to change the process. Furthermore, the controller 120 can use tool level rules to control some, most, or all tool level operations.

In general, rules allow the system and/or tool operation to change based on the dynamic state of the system.

In FIG. 1, only one processing tool 110 and one controller 120 are shown, but this particular arrangement is not required for the invention. The semiconductor processing system can comprise any number of processing tools having any number of controllers associated with them in addition to independent process tools and modules.

The processing tool 110 and/or the controller 120 can be used to configure any number of processing tools having any number of processing tools associated with them in addition to any number of independent process tools and modules. The processing tool 110 and/or the controller 120 can collect, provide, process, store, and display data from processes involving processing tools, processing subsystems, process modules, and sensors.

The processing tool 110 and/or the controller 120 can comprise a number of applications including, but not limited to, at least one tool-related application, at least one module-related application, at least one sensor-related application, at least one interface-related application, at least one database-related application, at least one GUI-related application, and at least one configuration application.

For example, the system 100 can comprise an APC system from Tokyo Electron Limited that can include a Unity Tool™, Telius Tool™, and/or a Trias Tool™, and their associated processing subsystems and process modules. In addition, the system 100 can comprise a run-to-run (R2R) controller, such as the Ingenio TL ES (Tool Level Etch System) or the Ingenio™ GL ES (Group Level Etch System) server from Tokyo Electron Limited, and an integrated metrology module (IMM) from Tokyo Electron Limited. Alternately, the controller 120 can support other process tools and other process modules.

A GUI component (not shown) can provide easy to use interfaces that enable, among other things, users to: view tool status and process module status; create and edit x-y charts of summary and raw (trace) parametric data for selected wafers; view tool alarm logs; configure data collection plans that specify conditions for writing data to the database or to output files; input files to statistical process control (SPC) charting, modeling and spreadsheet programs; examine wafer processing information for specific wafers, and review data that is currently being saved to the database; create and edit SPC charts of process parameters, and set SPC alarms which generate e-mail warnings; run multivariate PCA (Principle Component Analysis and/or PLS (Partial Least Squares) models; and view diagnostics screens in order to troubleshoot and report problems with the TL controller 120, among others.

Raw data and trace data from the tool can be stored as files in a database. In addition, IM data and host metrology data can be stored in the database. The amount of data depends on the data collection plans that are configured, as well as the frequency with which processes are performed and processing tools are run. The data obtained from the processing tools, the processing chambers, the sensors, and the operating system can be stored in the database.

In an alternate embodiment, the system 100 can comprise a client workstation (not shown). The system 100 can also support a plurality of client workstations. A client workstation can allow a user, among other things, to: perform configuration procedures; to view status including tool, controller, process, and factory status; to view current and historical data; to perform modeling and charting functions; and to input data to the controller. For example, a user may be provided with administrative rights that allow him to control one or more processes performed by the controller 120.

The processing tool 110 and the controller 120 can be coupled to the MES 130 and can be part of an E-Diagnostic System (Electronic Diagnostic System). The processing tool 110 and/or the controller 120 can exchange information with the factory system 130. In addition, the MES 130 can send command and/or override information to the processing tool 110 and/or the controller 120. For example, the MES 130 can feed-forward to the processing tool 110 and/or the controller 120 downloadable recipes for any number of process modules, tools, and measuring devices, with variable parameters for each recipe. Variable parameters can include final CD targets, limits, offsets, and variables in the tool level system that needs to be adjustable by lot. In addition, factory litho CD metrology data can be feed-forwarded to the controller 120.

Furthermore, the MES 130 can be used to provide measurement data, such as Critical Dimension-Scanning Electron Microscope (CD SEM) information, to the controller 120. Alternately, the CD SEM information can be provided manually. Adjustment factors are used to adjust for any offset between the IM and CD SEM measurements. Manual and automated input of CD SEM data includes a timestamp, such as a date, for proper insertion in to the history of the feedback (FB) control loop in the R2R controller.

Configurable items can be configured as a set of variable parameters sent from the factory system using GEM SECS (Generic Equipment Model/SEMI Equipment Communication Standard (GEM)/SECS) interface communications protocol. For example, variable parameters can be passed as part of an "APC Recipe". An APC recipe may contain more than one sub recipes and each sub recipe can contain variable parameters.

A single processing tool 110 is shown in FIG. 1, but this is not required for the invention. Alternately, additional processing tools can be used. In one embodiment, the processing tool 110 can comprise one or more processing modules. The processing tool 110 can comprise at least one of an etch module, a deposition module, a polishing module, a coating module, a developing module, and a thermal treatment module, among other module types.

The processing tool 110 can comprise links 112 and 114 for coupling to at least one other processing tool 110 and/or controller 120. For example, other processing tools 110 and/or controllers 120 can be associated with a process that has been performed before this process, and/or other controllers 120 can be associated with a process that is performed after this process. The link 112 and the link 114 can be used to feed-forward (FF) and/or feedback (FB) information. For example, feed-forward information can comprise data associated with an in-coming wafer. This data can include, among other information, lot data, batch data, run data, composition data, and wafer history data. The data can comprise pre-process data that can be used to establish an input state for a wafer. A first part of the pre-process data can be provided to the controller 120, and a second part of the pre-process data can be provided to the processing tool 110. Alternately, the two parts can comprise the same data.

The processing tool 110 can comprise a single integrated metrology module (IMM) device (not shown) or multiple measurement devices. The system 100 can include module related measurement devices, tool-related measurement devices, and external measurement devices. For example, data can be obtained from sensors coupled to one or more process modules and sensors coupled to the processing tool 110. In addition, data can be obtained from an external device such as a SEM tool and an Optical Digital Profiling (ODP) tool. An ODP tool is available for Timbre Technologies Inc. (a TEL company) that provides a proprietary technique for measuring the profile of a structure in a semiconductor device. For example, ODP techniques can be used to obtain CD information, structure profile information, or via profile information.

The controller 120 is coupled to the processing tool 110 and the MES 130, and information such as pre-processing data and post-processing data can be exchanged between them. For example, when an internal reset event is being generated from the tool 110, the controller 120 can send a message, such as an alarm, to the MES 130. This can allow the factory system and/or factory personnel to make the necessary changes to minimize the number of wafers at risk after a major change occurs such as those that occur during corrective or preventative maintenance.

A single controller 120 is also shown in FIG. 1, but reliance on only one controller 120 is not required to practice the invention. Alternately, additional controllers 120 can be used. For example, the controller 120 can comprise a run-to-run (R2R) controller, a feed-forward (FF) controller, a process model controller, a feedback (FB) controller, or a process controller, or a combination of two or more thereof (all not shown in FIG. 1).

The controller 120 can comprise links 122 and 124 for coupling to at least one other controller 120. For example, other controllers 120 can be associated with a process that has been performed before this process, and/or other controllers 120 can be associated with a process that is performed after this process. The link 122 and the link 124 can be used to feed forward and/or feed back information.

The controller 120 can use the difference between a measured critical dimension of the incoming material (input state) and a target critical dimension (desired state) to predict, select, or calculate a set of process parameters to achieve a desired process result that is changing the state of the wafer from the input state to the desired state. For example, this predicted set of process parameters can be a first estimate of a recipe to use based on an input state and a desired state. In one embodiment, data such the input state and/or the desired state data can be obtained from a host.

In one case, the controller 120 knows the input state and a model equation for the desired state for the wafer, and the controller 120 determines a set of recipes that can be performed on the wafer to change the wafer from the input state to a processed state. For example, the set of recipes can describe a multi-step process involving a set of process modules.

The time constant for the controller 120 can be based on the time between measurements. When measured data is available after a lot is completed, the controller's time constant can be based on the time between lots. When measured data is available after a wafer is completed, the controller's time constant can be based on the time between wafers. When measurement data is provided real-time during processing, the controller's time constant can be based on processing steps, which are performed on a wafer. When measured data is available while a wafer is being processed or after a wafer is completed or after the lot is completed, the controller 120 can have multiple time constants that can be based on the time between process steps, between wafers, and/or between lots.

One or more controllers 120 can be operating at any point in time. For example, a first controller 120 can be in an operating mode while a second controller 120 can be in a monitoring mode. In addition, another controller 120 can be operating in a simulation mode. A controller 120 can comprise a single loop or multiple loops, and the loops can have different time constants. For example, different loops can be dependent on wafer timing, lot timing, batch timing, chamber timing, tool timing, and/or factory timing, among other factors.

The controller 120 can compute a predicted state for the wafer based on the input state, the process characteristics, and a process model. For example, a trim rate model can be used along with a processing time to compute a predicted trim amount. Alternately, an etch rate model can be used along with a processing time to compute an etch depth, and a deposition rate model can be used along with a processing time to compute a deposition thickness. In addition, models can include SPC charts, PLS models, PCA models, Fault Detection and Classification (FDC) models, and Multivariate Analysis (MVA) models, among others.

The controller 120 can receive and utilize externally provided data for a process parameter and/or process parameter limits in a process module. For example, the controller GUI component provides a means for the manual input of a process parameter and/or the process parameter limits. In addition, a factory level controller can provide process parameter limits and/or process parameters for one or more process modules.

In addition, the controller 120 can receive and utilize externally provided process module state data for a process module. Process module state data can be used to calculate a current process state and/or a predicted process state. For example, process module state data can include processing time, RF Hours, number of wafers processed since a wet clean or some other event, input from a sensor, input from a process module, fault data, and calculation data from an analysis plan. The controller GUI component can provide a means for the manual input of process module state data and means for viewing the process module state data. In addition, a factory level controller can provide process module state data for one or more process modules.

The controller 120 can receive and execute models created by commercially available modeling software. For example, the controller 120 can receive and execute models (PLS, PCA, etc.) that were created by external applications and sent to the controller 120.

The controller 120 can comprise one or more filters (not shown) to filter the metrology data in order to remove the random noise. An outlier filter can be used to remove outliers that are statically not valid and should not be considered in the calculation of the mean of a wafer measurement. A noise filter can be used to remove random noise and stabilize the control loop. For example, an Exponentially Weighed Moving Average (EWMA) or Kalman filter can be applied.

The controller 120 can send and receive notification of an exception condition. For example, the controller 120 can send and receive notifications to and from a factory level controller or a tool level controller. In addition, a notification can be sent via the e-Diagnostics network, e-mail, or pager (among others) after the identification of an exception condition.

The controller 120 can comprise a database component for archiving input and output data. For example, the controller 120 can archive received inputs, sent outputs, and actions taken by the controller 120 in a searchable database. In addition, the controller 120 can comprise means for data backup and restoration. In addition, the searchable database can include model information, configuration information, and historical information and the controller 120 can use the database component to backup and restore model information and model configuration information, both historical and current.

The controller 120 can comprise a web based user interface. For example, the controller 120 can comprise a web enabled GUI component for viewing the data in the database. The controller 120 can comprise a security component that can provide for multiple levels of access, depending on the permissions granted by a security administrator. The controller 120 can comprise a set of default models that are provided at installation time, so that the controller 120 can reset to default conditions.

The controller 120 can take various actions in response to an exception, depending on the nature of the exception. The actions taken on an exception can be based on the business rules established for the context specified by the system recipe, process recipe, module type, module identification number, load port number, cassette number, lot number, control job ID, process job ID and/or slot number, to name a few such business rules.

The controller 120 has the capability of managing multiple process models that are executed at the same time and are subject to different sets of process recipe constraints. The controller 120 can run in three different modes: simulation mode, test mode, and standard mode. One controller 120 can operate in simulation mode in parallel with the actual process mode.

When the semiconductor processing system 100 includes a host system and one or more processing systems, the host system can operate as the master system and can control and/or monitor a major portion of the processing operations. The host system can create a process sequence, and can send the process sequence to the processing system. In one embodiment, the process sequence can comprise a sequence of measurement module visits and processing module visits. A process job (PJ) can be created for each measurement module visit and each processing module visit.

In addition, virtual measurements can be made when a processing system controller 120 executes a simulation model. The results from simulation model executions can be stored and tracked as virtual measurements.

Figure 2:
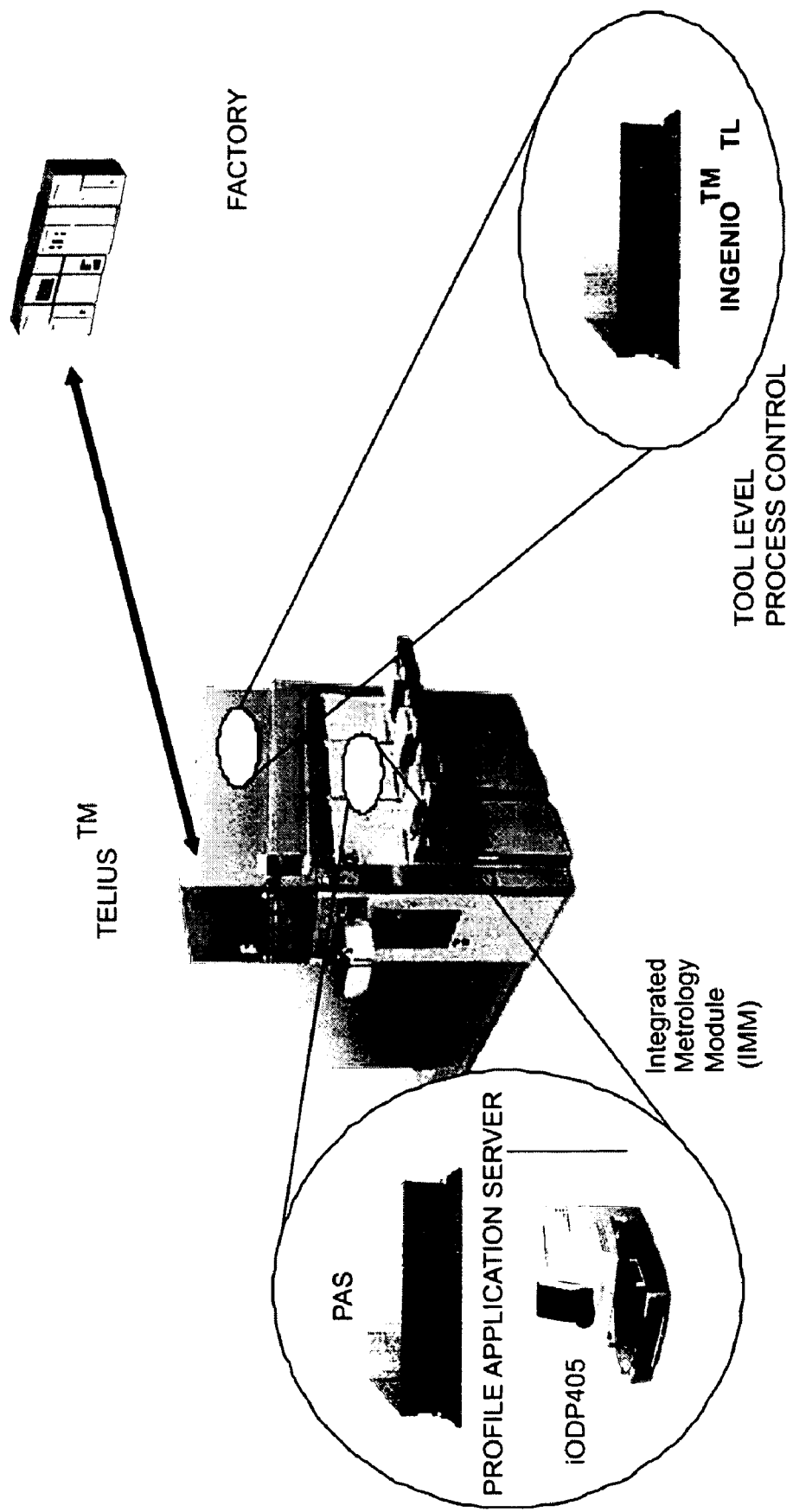
FIG. 2 shows a simplified block diagram of an integrated processing system in accordance with an embodiment of the invention.

FIG. 2 shows a simplified block diagram of an integrated processing system 100' in accordance with an embodiment of the invention. In the illustrated embodiment, a processing system (TELIUS) is shown that comprises a processing tool, an integrated metrology module (IMM), and a tool level Advanced Process Control (APC) controller. As would be appreciated by those skilled in the art, the components of the integrated processing system 100' are intended merely to be exemplary of the system of the present invention. As would be appreciated by those skilled in the art, and as will be made apparent from the discussion that follows, the permutations of combinations of components for the present invention is significant. Each such variation, while not discussed herein, is intended to fall within the scope of the present invention.

The system 100', such as shown in FIG. 2, can provide IMM wafer sampling and the wafer slot selection can be determined using a (PJ Create) function. The R2R control configuration can include, among other variables, feed-forward control plan variables, feedback control plan variables, metrology calibration parameters, control limits, and SEMI Standard variable parameters. Metrology data reports can include wafer, site, structure, and composition data, among others, and the tool can report actual settings for the wafer.

The IMM system can include an optical measuring system such as a Timbre Technologies' Optical Digital Profilometry (ODP) system that uses spectroscopic ellipsometry, reflectometry, or other optical instruments to measure true device profiles, accurate critical dimensions (CD), and multiple layer film thickness of a wafer. Timbre Technologies is a Tokyo Electron company located in Santa Clara, Calif. ODP, iODP, PAS, PAS Profiler, TeraGen, Aether, and Turbo Library are trademarks of Timbre Technologies.

The process is executed in-line, which eliminates the need to break the wafer for performing the analyses. ODP can be used with the existing thin film metrology tools for inline profile and CD measurement, and can also be integrated with TEL processing tools to provide real-time process monitoring and control. An ODP Profiler can be used both as a high precision metrology tool to provide actual profile, CD, and film thickness results, and a yield enhancement tool to detect in-line process excursion or process faults.

The ODP solution has three key components: an ODP Profiler Library comprises an application specific database of optical spectra and its corresponding semiconductor profiles, CDs, and film thicknesses. A Profiler Application Server (PAS) comprises a computer server that connects with optical hardware and computer network. It handles the data communication, ODP library operation, measurement process, results generation, results analysis, and results output. The ODP Profiler Software includes the software installed on PAS to manage measurement recipe, ODP Profiler library, ODP Profiler data, ODP Profiler results search/match, ODP Profiler results calculation/analysis, data communication, and PAS interface to various metrology tools and computer network.

A control system, such as Ingenio ES (Ingenio is a trademark of Tokyo Electron Ltd. and "ES" is an abbreviation for "Etch System") system from Tokyo Electron Limited, can comprise management applications, such as the Ingenio Recipe Management application. For example, the Ingenio Recipe Management can be used to view and/or control a recipe stored in the Ingenio ES Management Sever recipe database that is synchronized with equipment via a network environment from the Ingenio ES Client. An Ingenio ES Client, which can be placed separately at a distance from the factory, provides comprehensive management functions to multiple equipment units. Ingenio Recipe Management, as an Ingenio ES Client utility, can comprise a management application to view and control a recipe stored in the Ingenio ES, and an application to edit recipe data stored in the Ingenio ES Management Sever.

Recipes can be organized in a tree structure that can comprise recipe sets, classes, and recipes that can be displayed as objects. Recipes can include process recipe data, system recipe data, and IMM recipe data. Data can be stored and organized using recipe set. For example, the recipes sets can include an equipment recipe set, a backup recipe set, and a user recipe set. In addition, the data can be organized by class, and classes can include SYSTEM, PM, LLM, and IMM classes. For definitional purposes, SYSTEM refers to system level objects, PM refers to process module objects, LLM refers to load lock module objects, and IMM refers to integrated metrology module objects.

The IMM recipes that are on the processing tool can be used to determine wafer sampling and relationship between slots and IM recipes. IM recipes can exist on IM measurement hardware, can be selected in Telius IMM recipes, can contain pattern recognition information, can be used to identify the chips to sample on each wafer, and can be used to determine which PAS recipe to use. PAS recipes can be used to determine which ODP library to use, and to define the measurement metrics to report, such as CD, SWA, thickness, trench width, and GOF. For definitional purposes, SWA refers to side wall angle and GOF refers to goodness of fit.

Ingenio APC recipes operate as control strategies, and a control strategy can be associated with a processing tool recipe, such as a Telius System Recipe. Wafer level context matching at runtime allows for custom configuration by wafer (slot, wafer ID, lotID, etc.). A control strategy can include one or more control plans, and a process module and/or measurement module that is being controlled has at least one control plan defined for a visit to the process module and/or measurement module. Control plans can contain models, control limits, targets, and can include static recipes, formula models, and feedback plans.

Control plans can cover multiple process steps within a module, and can be controlled by the factory. Parameter ranges can be defined for each process and/or measurement module, and variable parameter "Limit Ranges" are provided for each control parameter.

Figure 3:
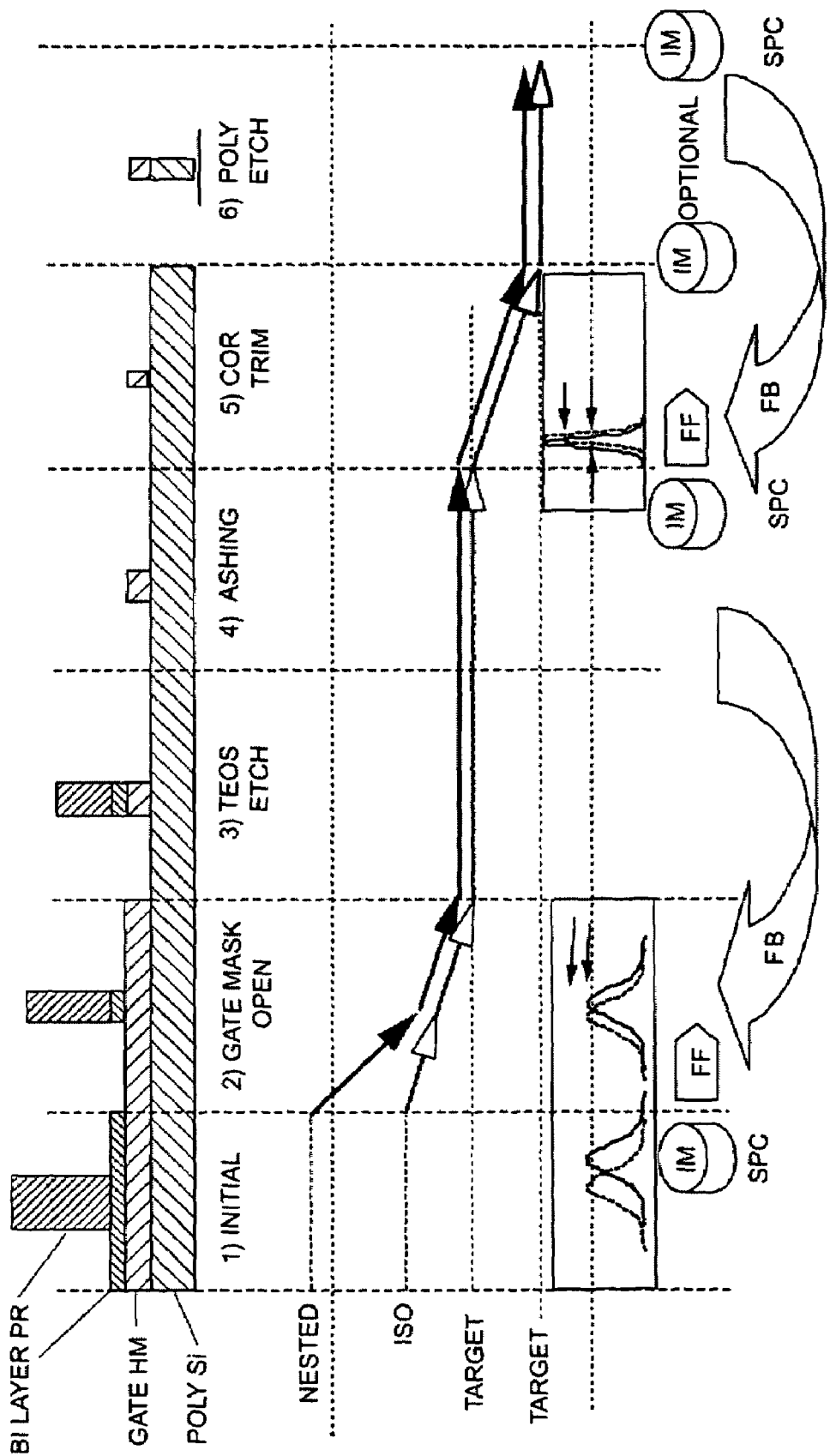
FIG. 3 shows a simplified flow diagram of a multi-step process sequence in accordance with an embodiment of the invention.

FIG. 3 shows a simplified flow diagram of a multi-step process sequence in accordance with an embodiment of the invention. In the illustrated embodiment, a number of measurement steps are shown, and a number of processing steps are shown. One or more control strategies can be created for each measurement step and/or processing step shown. This process sequence is not required for the invention. Alternately, other process sequences can be used, and a different number of control strategies and/or system recipes can be used.

In the illustrated embodiment, an initial step is shown in which measurements can be made to characterize a wafer after the photo resist has been developed. Measurement data can be obtained for nested and isolated regions on the wafer. In some cases, nested CDs can be larger then the isolated CDs. The second step shown illustrates a "Gate Mask" etch step in which a bi-layer photoresist layer can be processed. In the third step, a TEOS (i.e, tetraethlyorthosilicate) hard mask can be etched. In the fourth step, an ashing process can be performed. In the fifth step a trimming process, such as a COR process, can be performed. In the sixth step, a poly etch step can be performed.

FIG. 3 also illustrates the convergence of the measurements (the sine curves) as the wafer proceeds through the six steps. Moreover, the illustration provides two indications/instances of where information is fed forward (feed forward or "FF") and two instances where information is fed back (feed back or "FB"). As would be appreciated by those skilled in the art, the two FF and FB occurrences are merely illustrative and should not be construed to be limiting of the invention in any way.

Figure 4:
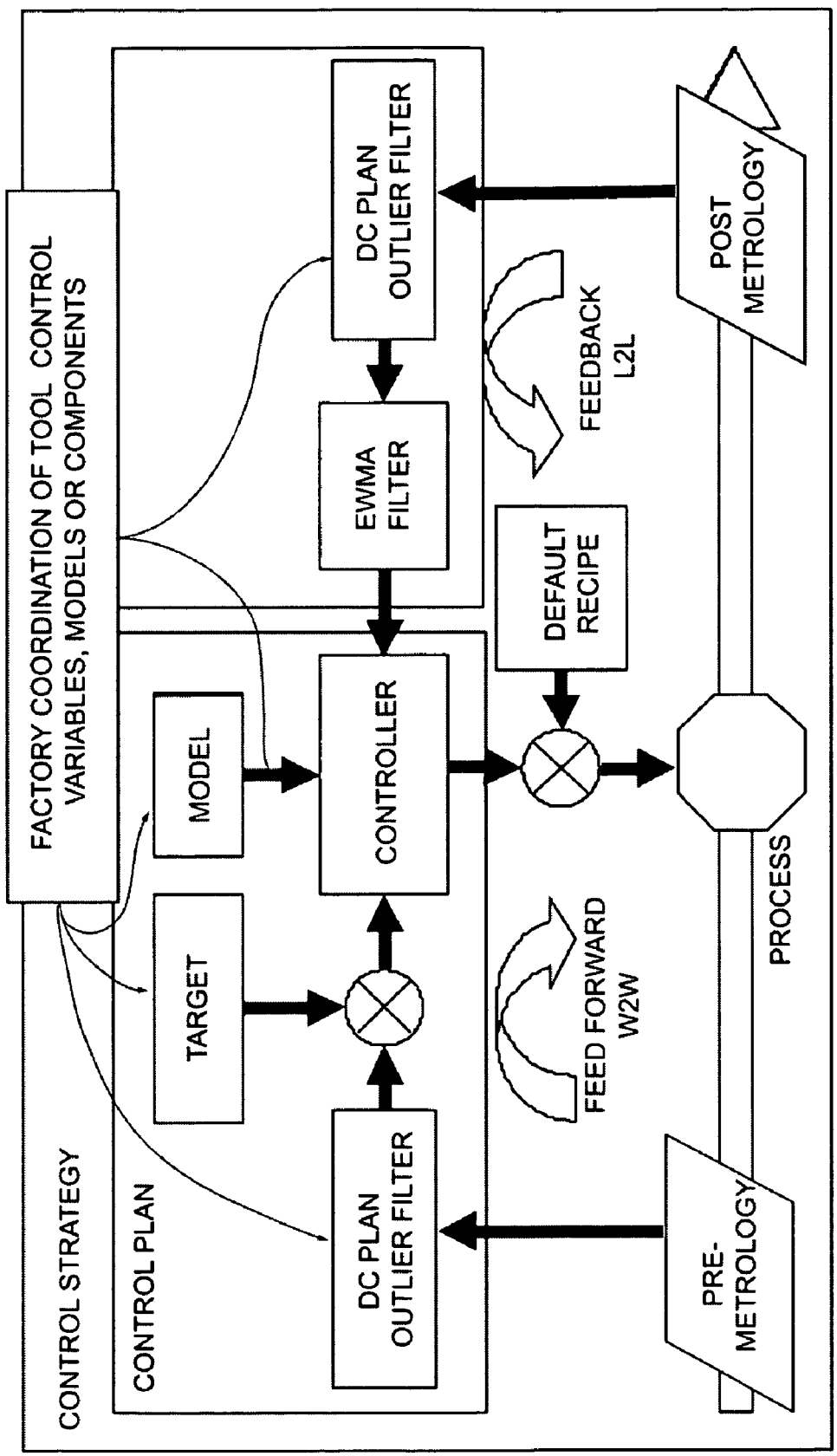
FIG. 4 shows a simplified block diagram of a control process in accordance with an embodiment of the invention.

FIG. 4 shows a simplified block diagram of a control process in accordance with another embodiment of the invention. In the illustrated embodiment, a simplified block diagram of a control plan is shown. Processing module and measurement module control plans and/or strategies can be created and executed.

In the illustrated embodiment, pre-metrology data and post-metrology data items are shown, but this is not required. Alternately, pre- and post-measurements may not be required for each process.

In addition, a W2W feed forward process s shown, and a L2L feedback process is shown, but this is not required. In alternate embodiments, other configurations can be used. Further discussion of the individual steps and their interaction is not provided here for several reasons. First, the precise combination of processes and steps is not necessary to practice the invention. Second, many of the steps have been described above in detail or are discussed in greater detail below.

Figure 5:
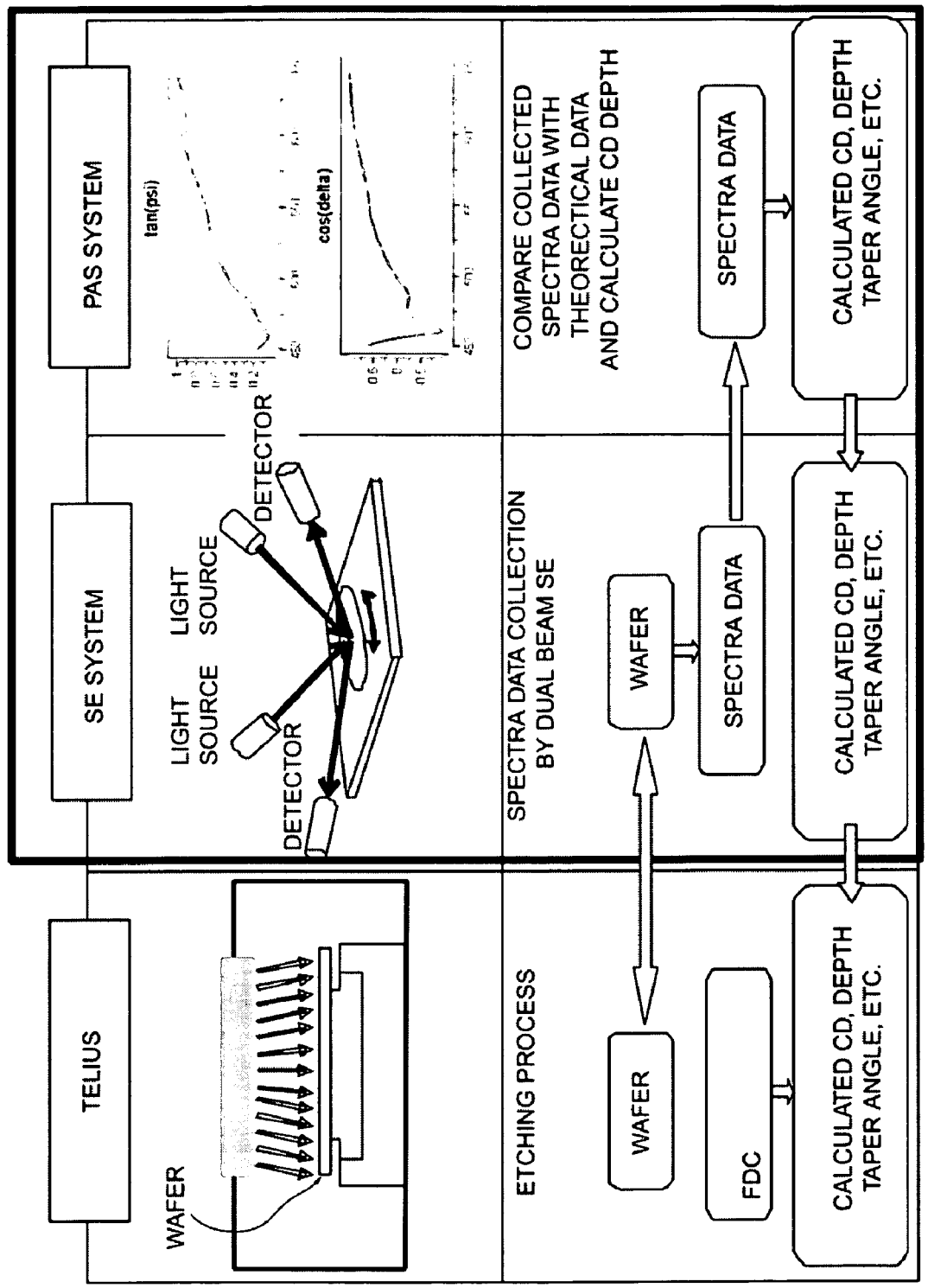
FIG. 5 shows a simplified block diagram of a processing system in accordance with an embodiment of the invention.

FIG. 5 shows a simplified block diagram of a processing system in accordance with an embodiment of the invention. In the illustrated embodiment, a (TELIUS) processing tool 510 is shown and an integrated metrology (IM) tool 520 is shown.

Spectral data can be collected using a dual beam SE system. The spectral data generated by IM module can be compared to the simulated spectra in an ODP/PAS Library. The matched spectra correspond to a profile with CD, film thickness, and sidewall angle information. Multiple kinds of grating like Iso/Dense can be measured in series.

During an iso/nested measurement sequence, the processing tool selects one IM recipe to use, and separate IMM recipes can be used for iso and nested structures. Each wafer can be measured separately for each pitch and structure.

For example, a wafer can be loaded into an integrated metrology (IM) module; an IM recipe can be loaded into the IM module; and a Profiler Application Server (PAS) recipe can be loaded into the IM controller. Next, the wafer can be measured and an ODP recipe can be loaded into the IM controller. The library can then be searched using the measured spectrum, and one or more isolated structures can be identified. When isolated structures are being measured, IM, PAS, and ODP recipes for isolated structures can be used.

Subsequently, another IM recipe can be loaded into an integrated metrology (IM) module, and another PAS recipe can be loaded into the IM controller. The wafer can be measured or previous measurement data can be used, and another ODP recipe can be loaded into the IM controller. Next, the library can be searched using the measured spectrum, and one or more nested structures can be identified. When Nested structures are being measured, IM, PAS, and ODP recipes for nested structures can be used. The measurement sequence can be performed for one or more different locations on a wafer, and the wafer can be unloaded.

Figure 6:
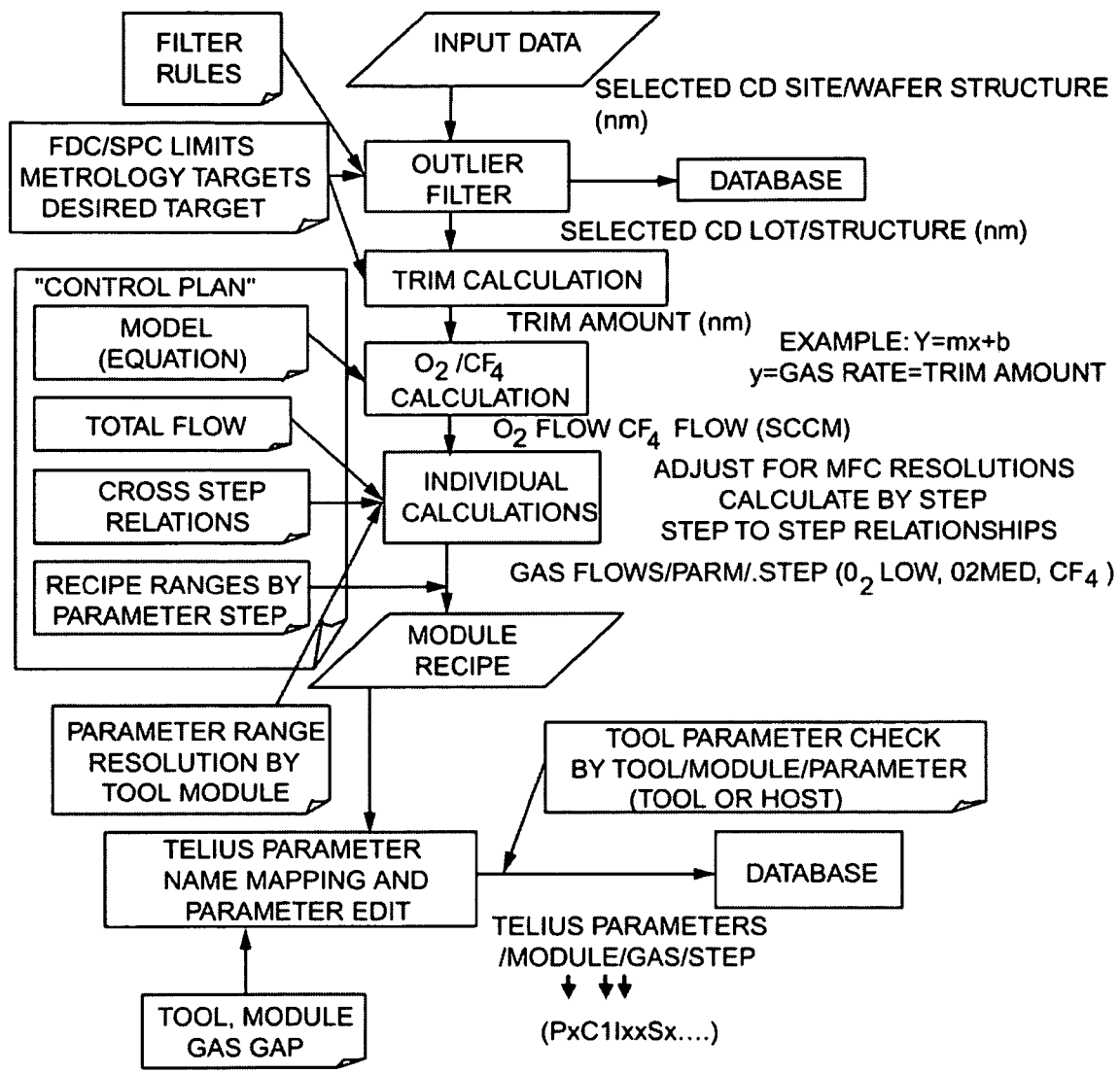
FIG. 6 shows a simplified flow diagram for a recipe creation process in accordance with an embodiment of the invention.

FIG. 6 shows a simplified flow diagram for a recipe creation process in accordance with an embodiment of the invention. In the illustrated embodiment, a module recipe is created using a trim amount as a desired process result and gas flows as the variable process parameters.

Input data can be received from a variety of sources including the processing tools and the factory system. Received data can be filtered and filtered data can be sent to a database, such as a host database and/or a database associated with a processing tool. Filter rules can be used to determine the nature of the filtering. For example, business rules may be used to establish filter rules.

Input data can include measured data and reference data. Reference data, such as CD SEM data, can be used to obtain a reference point for the expected state of an incoming wafer or a group of wafers. Measured data can be used to obtain an input state of an incoming wafer or a group of wafers. In general, there is an equation or a set of equations established to correlate the input state to the expected state. For example, measured metrology data can be correlated to reference data, such as CD SEM data.

The filtered data can be used to establish a desired process result, such as a trim amount. Target information can be used. For example, limits can be used to establish fault windows and process windows. The recipe conditions required to achieve the desired process result can be calculated. Design of Experiments ("DOE") techniques can be used to determine the best recipes to use and control plans can be used as one of the control elements. Recipes can be established based on the processing limitations of the available processing tools and processing modules.

When a module recipe is established, the module recipe can be verified by the processing tool and can be stored in a database. Process targets, models, and rules can be stored, controlled, and managed at the factory level.

Figure 7:
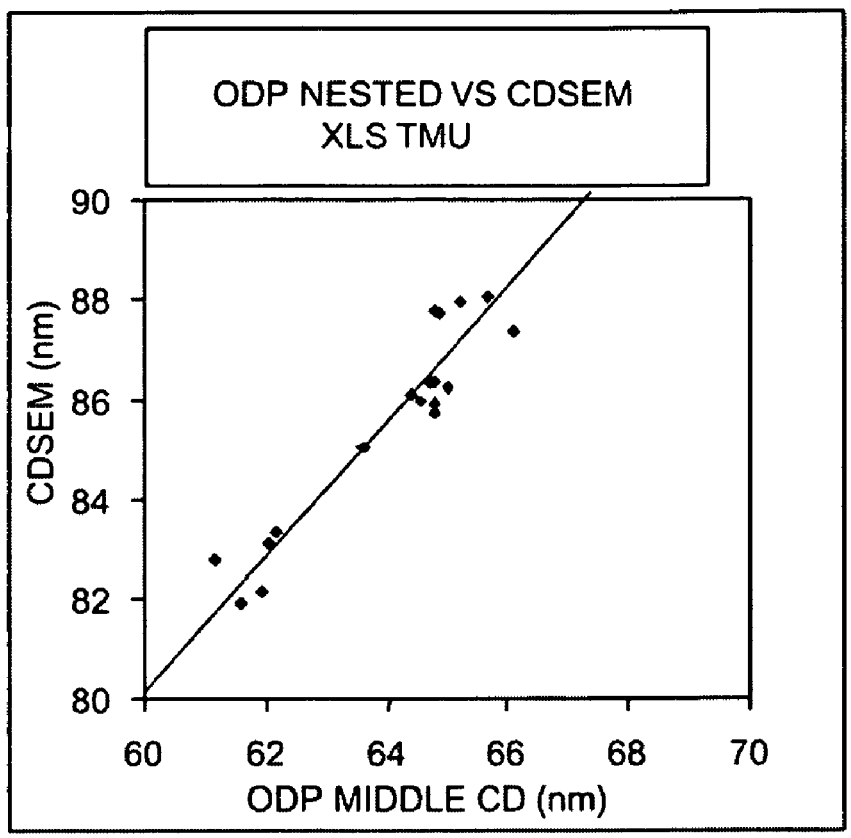
FIG. 7 shows an exemplary graph of an equation relating reference data to measured data in accordance with an embodiment of the invention.

FIG. 7 shows an exemplary graph of an equation relating reference data to measured data in accordance with an embodiment of the invention. In the illustrated embodiment, a graph is shown that relates CD SEM data to ODP data, but this is not required for the invention. Alternately, other forms of reference data and/or measured data can be used. The data shown relates to nested CDs on a wafer. Other graphs (not shown) can be used to establish equations for other sets of data, such as data for isolated CDs. Total Measurement Uncertainty (TMU) data is shown.

Figure 8:
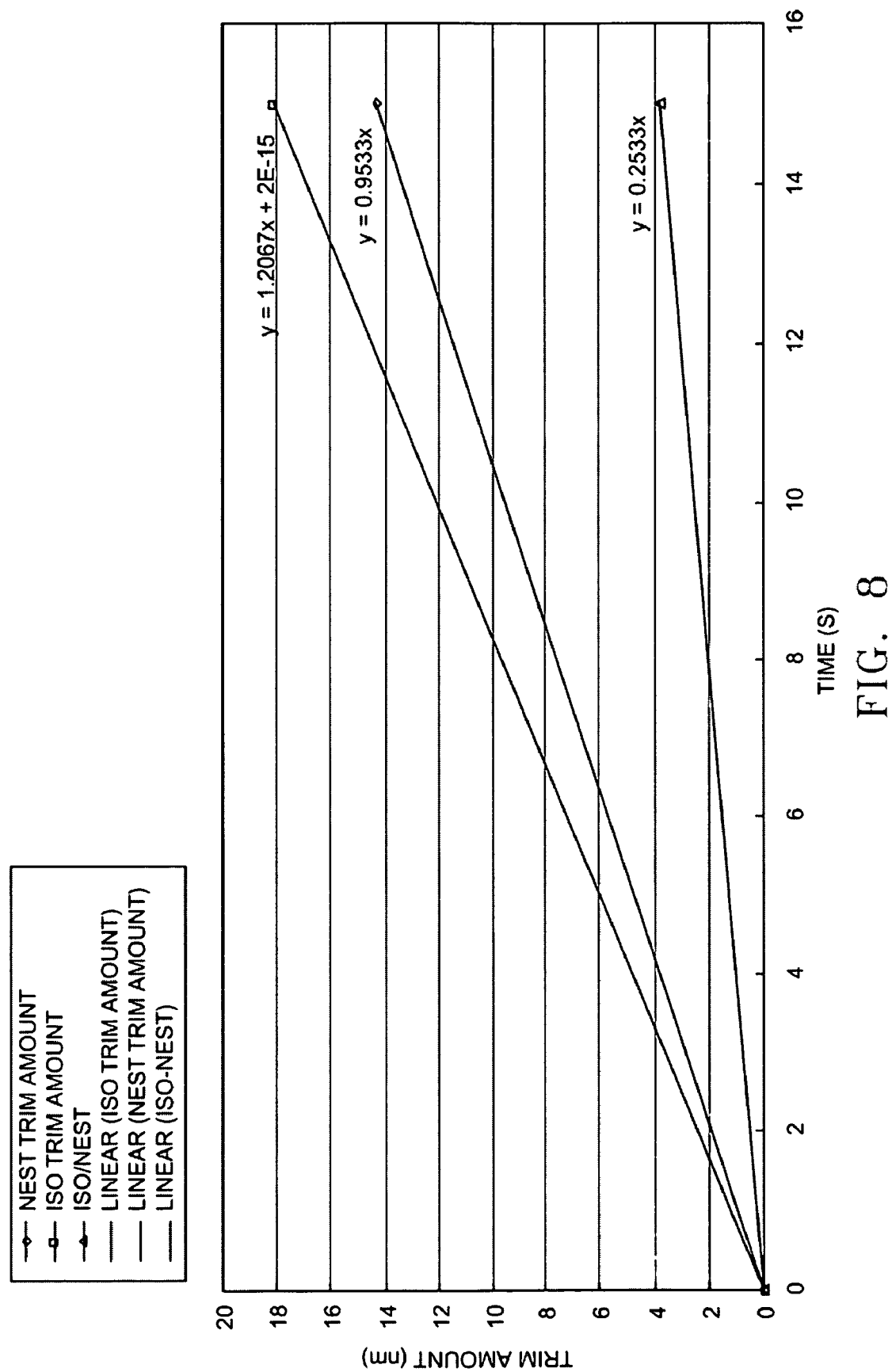
FIG. 8 shows a graph of exemplary trim equations in accordance with an embodiment of the invention.

FIG. 8 shows a graph of exemplary trim equations in accordance with an embodiment of the invention. In the illustrated embodiment, linear equations are shown for an (Iso trim amount), (Nest trim amount), and (Iso-Nest). Alternately, non-linear equations can be used.

In one case, the isolated structures etch faster than the Nested structures. Alternately, other rates can be used. In addition, the Isolated CDs can be larger than the Nested CDs. Alternately, other relationships can be made. In addition, the variation within the nested CDs can be greater.

In one part of the procedure, an Iso-nested bias can be calculated. For example, the ODP data for each structure can be correlated to reference data, such as CD SEM data.

In one embodiment, a measurement grating having a first pitch is provided that is consistent with the isolated structures/features for a particular product and technology and another measurement grating having a second pitch is provided that is consistent with the nested structures/features for this product and technology. For example, a 595 nm grating can be used for isolated structures and a 245 nm grating can be used for nested structures. In alternate embodiments, additional measurement gratings may be provided and different pitches may be provided.

The calculated isolated data value can be determined using the formula:

$$Iso_c = Iso\_Mandel\_Slope * Iso\_ODP + Iso\_Mandel\_Intercept$$

where Iso_Mandel_Slope is the slope of the line relating the CD SEM data to the ODP data for isolated structures, Iso_ODP is the value of one of the ODP measurements for one of the isolated structures, and Iso_Mandel_Intercept is the intercept point of the line relating the CD SEM data to the ODP data for isolated structures.

The calculated isolated data value can be determined using the formula:

$$Nested_c = Nested\_Mandel\_Slope * Nested\_ODP + Nested\_Mandel\_Intercept$$

where the Nested_Mandel_Slope is the slope of the line relating the CD SEM data to the ODP data for nested structures, the Nested_ODP is the value of one of the ODP measurements for one of the nested structures, and the Nested_Mandel_Intercept is the intercept point of the line relating the CD SEM data to the ODP data for nested structures.

The value for a bias amount can be determined using the formula:

$$Bias(nm) = Iso_c - Nested_c$$

The trim adjustment amount needed can be determined using the formula:

$$Bias\_Trim = Bias - Bias\_Target$$

The Recipe Setting required can be determined using the formula:

$$Recipe\ Setting = Bias\_Trim = y = f(x)$$

For example, one control parameter can be set equal to the Step Process Time (seconds), and can be determined using the formula:

$$Step\_Time = Bias\_Trim/(Iso\ Nested\ Etch\ Rate)$$

where Step_Time is "iso/nested control step".

Another way to control a hard mask etch (process would be to provide an intermediate pitch between either fully nested or isolated. In this case, the Iso/nest adjustment could be calculated as previously shown. The trim amount needed could be calculated; the CD of a control structure could be determined based on additional measurements; a correlation could be developed between the control pitch and another pitch; the existing measurements could be calibrated to the control pitch; and the trim amount could be calculated using the formula:

$$Trim\ amount = CD\ for\ control\ structure - CD\ target\ for\ control\ structure$$

Table 1 shows an exemplary set of process parameters for processing a wafer having isolated and nested structures. A number of trim processes are shown, but these are not required for the invention. Alternately, a different set of process parameters may be used and additional process gasses can be used.

In one embodiment, the process chemistry includes $HBr/O_2$ when the trim amount for Isolated structures is greater than the trim amount for Nested structures; the process chemistry includes $C_4F_8/O_2$ when the trim amount for Isolated structures is less than the trim amount for Nested structures; and the process chemistry includes $HBr/C_4F_8/O_2$ when the trim amount for Isolated structures is approximately equal to the trim amount for Nested structures. In alternate embodiments, inert gasses may be included in the process chemistry.

TABLE 1

| Condition | Press. (mT) | Power T/B(W) | Gap (mm) | O2 | C4F8 (SCCM) | HBr | H.V. (kV) | B.P.(C/E) (Torr) | Temp. T/W/B(C.) |
|---|---|---|---|---|---|---|---|---|---|
| | | | | HBr/O2 | | | | | |
| Trim | 30 | 200/0 | 170 | 70 | | 12 | 2.5 | 3/3 | 80/60/30 |
| | | | | C4F8/O2 | | | | | |
| Trim | 30 | 200/0 | 170 | 70 | 10 | | 2.5 | 3/3 | 80/60/30 |
| | | | | HBr/C4F8/O2 | | | | | |
| Trim | 30 | 200/0 | 170 | 70 | 10 | 15 | 2.5 | 3/3 | 80/60/30 |

Next, the additional trim (remaining BARC Trim) can be determined based on the amount of BARC Trim made during the bias trim process. The BARC_Bias_Trim variable value can be approximated using the average value for the iso etch rate, and the step_time variable value can be passed from another Control plan.

For example, the following formulas can be employed:

$$BARC\_Bias\_Trim = (Average\ Iso\ Trim\ Amount/Trim\ time) * Step\_time$$

$$BARC\_Bias\_Trim = (18.1/15) * Step\_time$$

$$BARC\_Trim = Iso_c - BARC\_Bias\_Trim - Final\ CD\ Target(Iso)$$

In an alternate embodiment, the calculations can be based on nested values.

In addition, recipe settings for the final BARC trim can be computed. For example, when using a $O_2/CF_4$ ratio, an equation can be created:

$$BARC\_Trim = y = f(x)$$

where x is $O_2$ flow, and $$y=48.416083725*(1-0.00388123723/((0.020654293/80)*x+0.0046147421))$$

In some cases, out of range exceptions may occur. For example, the calculated Iso/nested value can be larger than total trim value, or the Iso value can be larger than the nested incoming CD. One solution would be to check the sign and make a set of computations based on the need to grow nested. When the value is off the iso/nested bias trim curve, the maximum bias adjustment may be used. When the value is off the low end of the trim curve, the solution can be to skip the trim, and when the value is off the high end of the trim curve, the solution can be to use max trim and generate a warning to the host.

Figure 9:
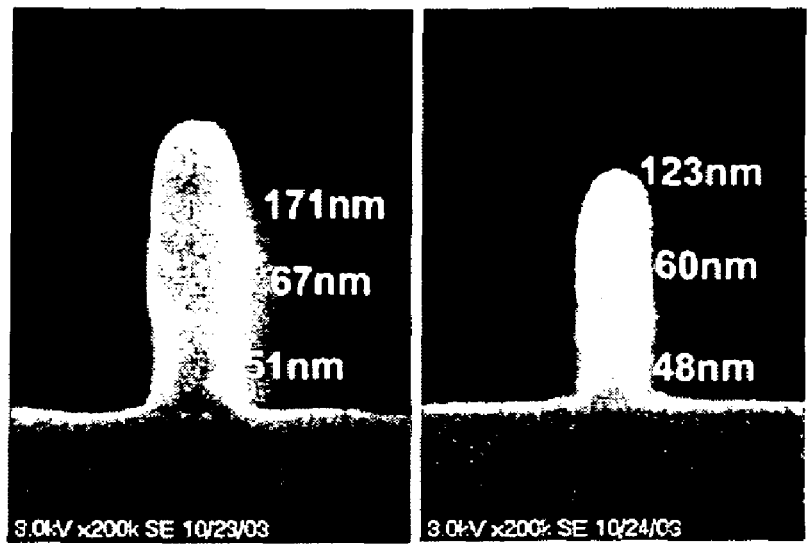
FIG. 9 shows SEM pictures illustrating results from an exemplary process in accordance with an embodiment of the invention.
Figure 9:
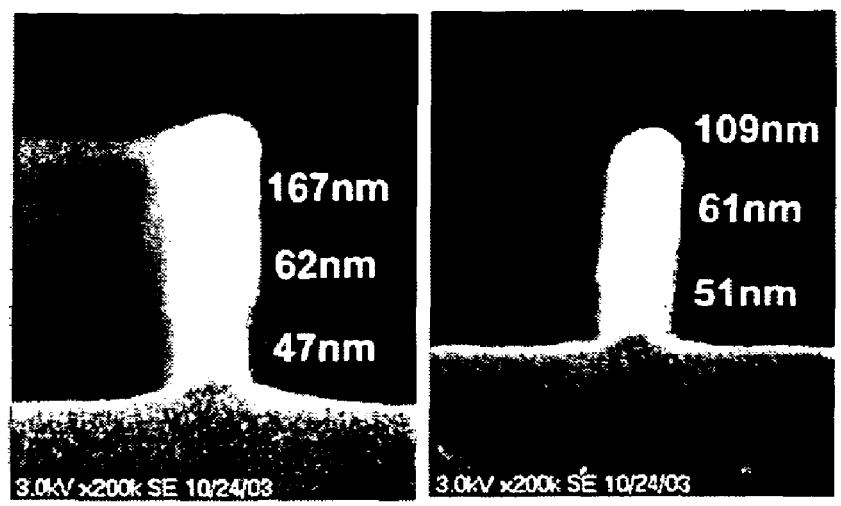

FIG. 9 shows SEM pictures illustrating results from an exemplary process in accordance with an embodiment of the invention. In the illustrated embodiment, SEM graphs are shown for a center profile and an edge profile. In addition, SEM graphs are shown for a BARC etch and a combined BARC etch and a trim process (15 seconds). As is apparent from the pictures, the results using the combined processes (shown to the right of the illustration) are better.

Figure 10:
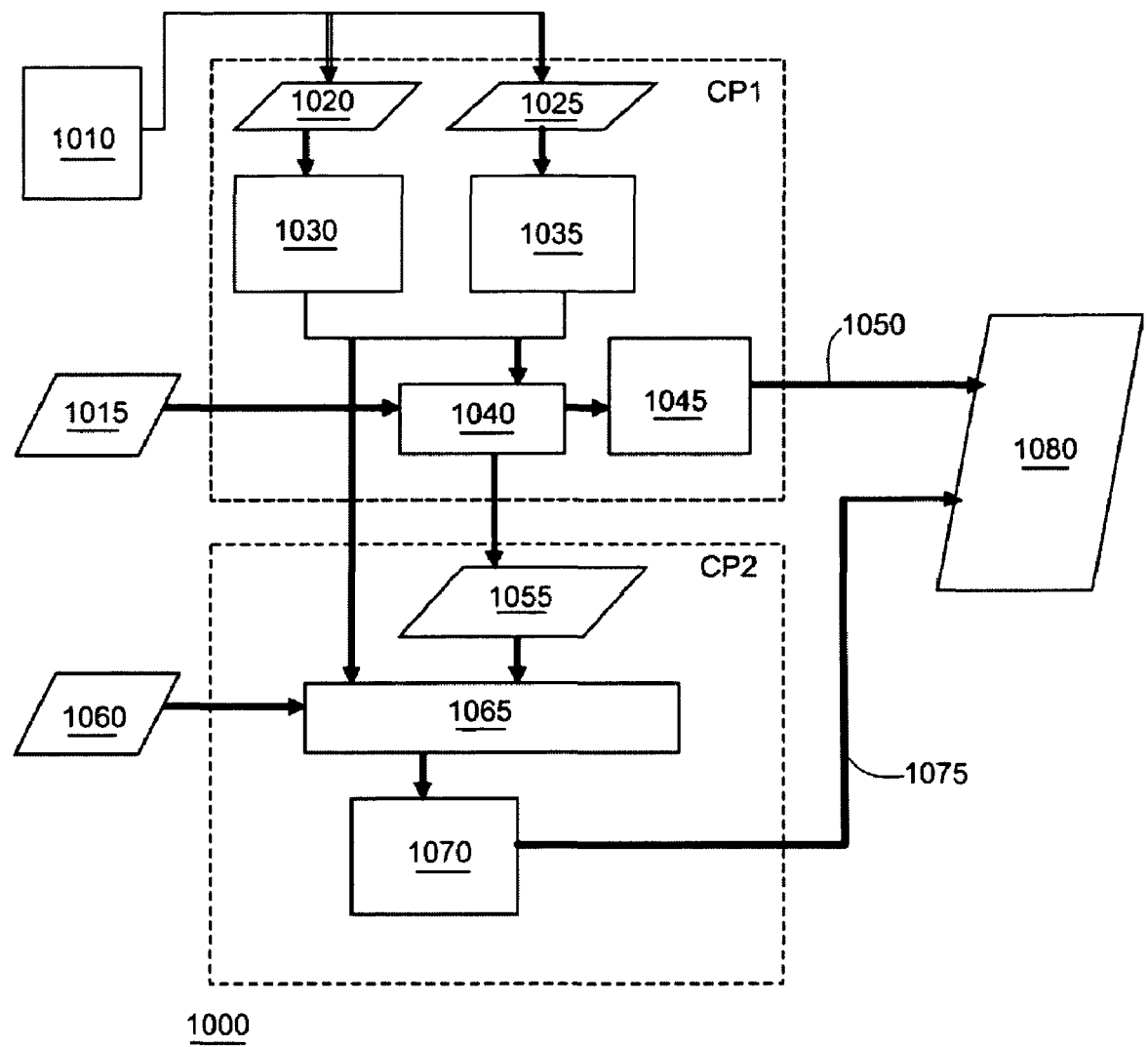
FIG. 10 shows a simplified sequence diagram for a method of operating a processing system in accordance with an embodiment of the invention.

FIG. 10 shows a simplified sequence diagram for a method of operating a processing system in accordance with an embodiment of the invention. In the illustrated embodiment, a cascading feed-forward wafer-to-wafer calculation sequence 1000 is shown, but this is not required for the invention. Alternately, the sequence can be lot-based or batch-based, among other variations.

In the illustrated embodiment, sequence 1000 includes two control plans, a first control plan CP1 and a second control plan CP2, but this is not required for the invention. Alternately, a different number of control plans may be used. For example, separate control plans may be used for isolated and nested conditions, and other control plans may also be used.

In the embodiments illustrated in FIGS. 10–16, the term "first control plan CP1" and "second control plan CP2" are used to refer to the two control plans illustrated. As would be appreciated by those skilled in the art, each of the embodiments may include a greater number of control plans (or only one control plan) as desired. While the designation "first control plan CP1" and "second control plan CP2" are used with respect to several of the described embodiments, this convention has been adopted to simplify the discussion that follows. As the illustrations make clear, the exact composition of the individual control plans differs from one plan to the next, despite the repeated used of the same descriptors and reference numbers.

The first control plan CP1 can be coupled to a first input element 1010 and can include one or more data elements, such as 1020 and 1025. Alternately, a different number of input elements and/or data elements can be used. The data element 1020 can include "Iso" data and can include metrology data for at least one area on the wafer that comprises isolated structures, trenches, or vias, or combinations thereof. The data element 1025 can include "Nested" data and can include metrology data for at least one area on the wafer that comprises nested structures/features, trenches, or vias, or combinations thereof. Alternately, other data elements (not shown) can be included such as a "Reference", "Mixed", or "Nominal" data element.

The first input element 1010 can comprise Optical Digital Profilometry (ODP) data from an integrated metrology module (IMM), such as an iODP module from Tokyo Electron Ltd. Alternately, the first input element 1010 may include SEM data and/or TEM data.

The first control plan CP1 can also include data conversion elements, such as 1030 and 1035. The data conversion element 1030 can be coupled to the data element 1020 and can be used to convert one or more of the data items in the data element 1020. For example, the data conversion element 1030 can be used to calibrate the "Iso" data to "CD-SEM" data. An equation and/or table can be established that relates the metrology data for "isolated" structures from one metrology module (IMM) to another metrology module (SEM). The data conversion element 1035 can be coupled to data element 1025 and can be used to convert one or more of the data items in the data element 1025. For example, the data conversion element 1035 can be used to calibrate the "Nested" data to "CD-SEM" data. An equation and/or table can be established that relates the metrology data for "nested" structures from one metrology module (IMM) to another metrology module (SEM). One metrology module may be used to provide "Reference" data.

The second input element 1015 can be coupled to the first control plan CP1 and can comprise input data and/or output data for a process module in a processing tool, such as a TELIUS tool from Tokyo Electron Ltd. Alternately, the second input element 1015 may include historical data. In one embodiment, the second input element 1015 can comprise a desired value for a process parameter, such as a "Bias Target".

In addition, the first control plan CP1 can include one or more computational elements, such as 1040 and 1045. The computational element 1040 can be coupled to the second input element 1015, one or both of the data conversion elements 1030, 1035, and to one or more other control plans. In one embodiment, the computational element 1040 can be used to compute one or more processing parameters. For example, in an etch process, one or more process parameters can be controlled to optimize the etch process for isolated and/or nested structures. In one case, the process parameter may be a "Bias Trim".

The computational element 1045 can be coupled to computational element 1040, and can provide one or more outputs 1050. In one embodiment, the computational element 1045 can be used to compute one or more recipe parameters, and the outputs 1050 may include "step time" data for one or more process steps. Alternately, the outputs 1050 may include other process data and/or tool data.

A third input element 1060 can be coupled to the second control plan CP2 and can comprise input data and/or output data for a process module in a processing tool, such as a TELIUS tool from Tokyo Electron Ltd. Alternately, the third input element 1060 may include historical data. In one embodiment, the third input element 1060 can comprise a desired value for a process result, such as a "Final CD Target".

The second control plan CP2 can be coupled to one or more other control plans, such as the first control plan CP1, and can include one or more data elements, such as 1055. Alternately, a different number of control plans and/or data elements can be used. The data element 1055 can comprise calculated data, such as "Bias Trim" data and/or "Step Time"

data. Alternately, data element 1055 may include other feed-forward and/or feedback data items.

In addition, the second control plan CP2 can include one or more computational elements, such as 1065 and 1070. The computational element 1065 can be coupled to the third input element 1060, the data element 1055 and to one or more other computational elements, such as 1070. In one embodiment, the computational element 1065 can be used to compute one or more processing parameters. For example, in an etch process, one or more process parameters can be controlled to optimize the etch process for isolated and/or nested structures. In one case, the process parameter may be a "BARC Trim".

The computational element 1070 can be coupled to the computational element 1065, and can provide one or more outputs 1075. In one embodiment, the computational element 1070 can be used to compute one or more recipe parameters, and the output 1075 may include flow data for one or more process gasses or one or more flow ratios for the process gasses. For example, a flow ratio can be provided for $O_2$ and $CF_4$. Alternately, the output 1075 may include other process data and/or tool data.

The sequence 1000 can also comprise a control strategy element 1080. One or more system controllers (not shown) can contain a number of APC Recipes (Control Strategies) for controlling the operation of the system, and a Control Strategy can be associated with a system recipe for a processing tool.

In one embodiment, an "Iso/Nested" control strategy can be used. The "Iso/Nested" control strategy can include one or more "Iso/Nested" control plans, such as the control plans CP1 and CP2. A physical module under can have at least one control plan defined for each visit to the physical module. The first and second control plans CP1, CP2 contain models, limits, targets, recipes, and can cover multiple process steps within a module. In one embodiment, an "Iso/Nested" control strategy and/or plan can be established and mapped to a physical module. Control strategies and/or plans can be established when a Process Job (PJ) is received and/or created.

A system controller can execute an "Iso/Nested" control strategy when an "Iso/Nested" control plan in the process sequence is executed. The "Iso/Nested" control strategy can include one or more "Iso/Nested" control plans. The control strategy selection and initiation can be context-based. When an "Iso/Nested" control strategy is executed, a wafer can be processed in a physical module. Alternately, when the controller determines that an "Iso/Nested" control strategy that matches the processing context for a wafer does not exist, the controller can create and can execute a new "Iso/Nested" control strategy.

Context matching can be implemented using SQL (Sequel) statements that match all recipes that contain the context items. Alternately, SQL statements are not required, nor is it required that the statements be written in SQL format. As would be appreciated by those skilled in the art, formats other than SQL can be employed without departing from the scope of the invention.

In addition, the processing system controller can execute an "Iso/Nested" data collection (DC) strategy, the "Iso/Nested" data collection (DC) strategy can comprise at least one "Iso/Nested" data collection (DC) plan. The "Iso/Nested" DC strategy selection and initiation can also be context-based. When an "Iso/Nested" DC strategy is executed, data for isolated and nested structures can be collected for a wafer that is being processed.

The "Iso/Nested" DC plan determines which data is collected, how the data is collected, and where the data is stored. The controller can auto-generate data collection plans for physical modules. Typically, one data collection plan can be active at a time for a specific module, and the controller can select and use a data collection plan that matches the wafer context. Data can include trace data, process log information, recipe data, maintenance counter data, OES data, VIP data, or analog data, or a combination of two or more thereof. Measurement devices and/or sensors can be started and stopped by a DC plan. A DC plan can also provide information for trimming data, clipping data, and dealing with spike data and outliers.

Furthermore, the system controller can execute an "Iso/Nested" analysis strategy when a wafer is processed. The "Iso/Nested" analysis strategy can comprise an "Iso/Nested" analysis plan, or an "Iso/Nested" judgment plan, or a combination thereof. When an "Iso/Nested" analysis strategy is executed, wafer data, process data, and/or module data can be analyzed, and fault conditions can be identified.

For example, after the data has been collected, the data can be sent to a Fault Detection program for run-rule evaluation. Fault limits can be calculated automatically based on historical data, entered manually based on the customer's experience or process knowledge, or obtained from a host computer. The data can be compared with the warning and control limits, and when a run-rule is violated, an alarm can be generated, indicating the process has exceeded statistical limits. When an alarm is generated, the controller can perform either notification or intervention. Notification can be via e-mail or by an e-mail activated pager. In addition, the controller can perform an intervention: either pausing the process at the end of the current lot or pausing the process at the end of the current wafer. The controller can identify the processing module that caused the alarm to be generated.

Figure 11:
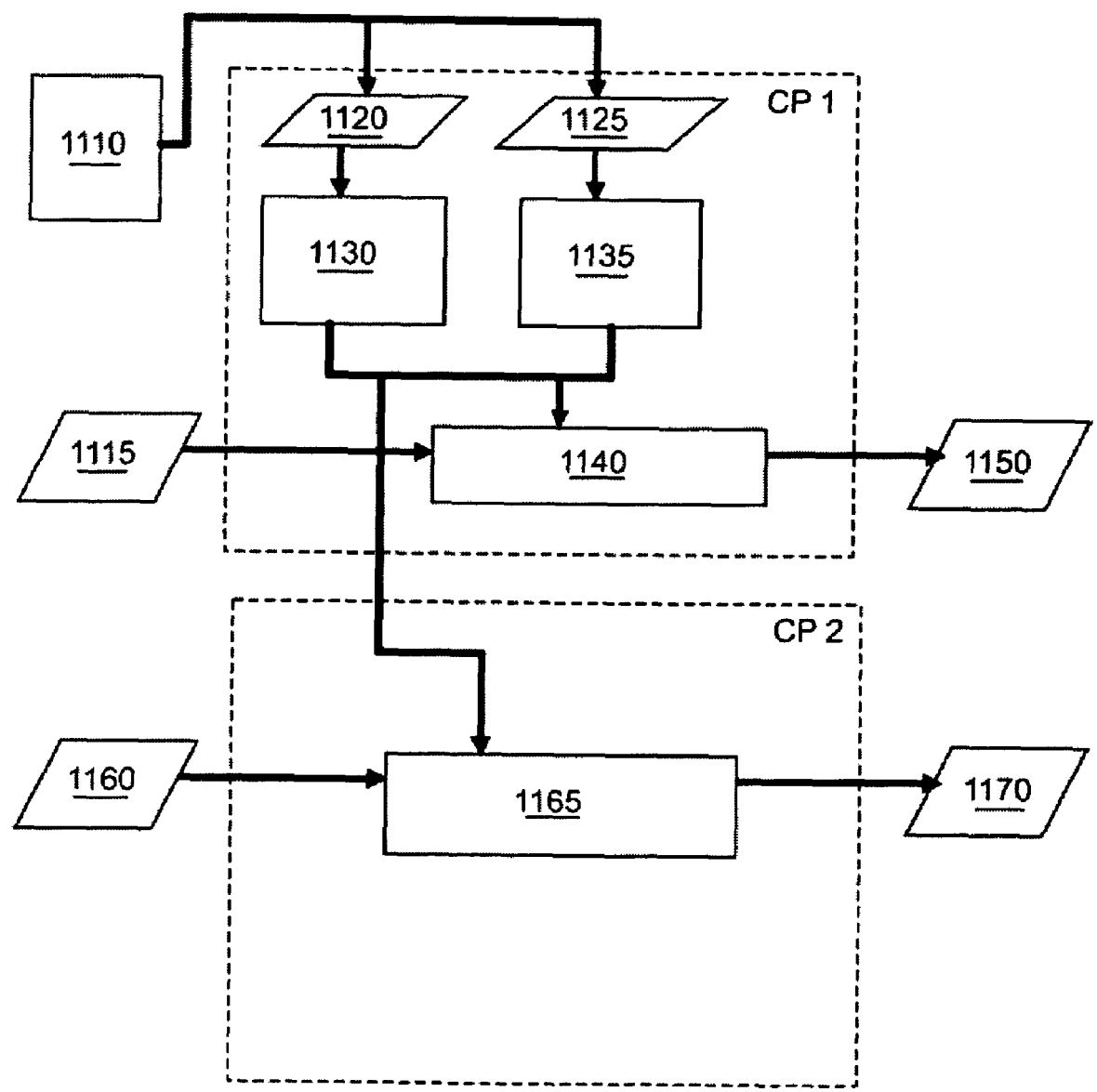
FIG. 11 shows a simplified sequence diagram for a method of operating a processing system in accordance with another embodiment of the invention.

FIG. 11 shows a simplified sequence diagram for method of operating a processing system in accordance with another embodiment of the invention. In the illustrated embodiment, a post measurement calculation sequence 1100 is shown, but this is not required for the invention. Alternately, the sequence can be a different sequence.

In the illustrated embodiment, sequence 1100 includes two control plans, a first control plan CP1 and a second control plan CP2, but this is not required for the invention. Alternately, a different number of control plans may be used. For example, separate control plans may be used for isolated and nested conditions, and other control plans may also be used.

The first control plan CP1 can be coupled to a first input element 1110 and can include one or more data elements, such as 1120 and 1125. Alternately, a different number of input elements and/or data elements can be used. The data element 1120 can include "Iso" data and can include metrology data for at least one area on the wafer that comprises isolated structures/features, trenches, or vias, or combinations thereof. The data element 1125 can include "Nested" data and can include metrology data for at least one area on the wafer that comprises nested structures/features, trenches, or vias, or combinations thereof. Alternately, other data elements (not shown) can be included such as "Reference", "Mixed", or "Nominal" data elements.

The first input element 1110 can comprise ODP data from an integrated metrology module (IMM), such as an iODP module from Tokyo Electron Ltd. Alternately, the first input element 1110 may include SEM data and/or TEM data.

The first control plan CP1 can also include data conversion elements, such as 1130 and 1135. The data conversion element 1130 can be coupled to the data element 1120 and can be used to convert one or more of the data items in the data element 1120. For example, the data conversion element 1130 can be used to calibrate the "Iso" data to "CD-SEM" data. An equation and/or table can be established that relates the metrology data for "isolated" structures from one metrology module (IMM) to another metrology module (SEM). The data conversion element 1135 can be coupled to the data element 1125 and can be used to convert one or more of the data items in the data element 1125. For example, the data conversion element 1135 can be used to calibrate the "Nested" data to "CD-SEM" data. An equation and/or table can be established that relates the metrology data for "nested" structures from one metrology module (IMM) to another metrology module (SEM). Alternately, "Reference" data may be used. In addition, the data conversion element 1130 and the data conversion element 1135 can be coupled to one or more other control plans, such as the second control plan CP2.

The second input element 1115 can be coupled to the first control plan CP1 and can comprise input data and/or output data for a process module in a processing tool, such as a TELIUS tool from Tokyo Electron Limited. Alternately, the second input element 1115 may include historical data. In one embodiment, the second input element 1115 can comprise a desired value for a process parameter, such as a "Bias Target".

In addition, the first control plan CP1 can include one or more computational elements, such as 1140. The computational element 1140 can be coupled to the second input element 1115, the data conversion elements 1130, 1135, and provide one or more outputs 1150. In one embodiment, the computational element 1140 can be used to compute one or more processing parameters. For example, in an etch process, one or more process parameters can be controlled to optimize the etch process for isolated and/or nested structures. In one case, the process parameter may be a "Bias Error". Alternately, the outputs 1150 may include other process data and/or tool data.

A third input element 1160 can be coupled to the second control plan CP2 and can comprise input data and/or output data for a process module in a processing tool, such as a TELIUS tool from Tokyo Electron Ltd. Alternately, the third input element 1160 may include historical data. In one embodiment, the third input element 1160 can comprise a desired value for a process result, such as a "Final CD Target".

The second control plan CP2 can be coupled to one or more other control plans, such as the first control plan CP1, and can include one or more computational elements, such as 1165. Alternately, a different number of control plans and/or computational elements can be used. The computational element 1165 can be coupled to the third input element 1160, another control plan, and to one or more output elements, such as 1170. In one embodiment, the computational element 1165 can be used to compute one or more processing parameters. For example, in an etch process, one or more process parameters can be controlled to optimize the etch process for isolated and/or nested structures. In one case, the process parameter may be a "BARC Trim Error", and the output element can include a "Trim Error". Alternately, the output 1175 may include other process data and/or tool data.

Figure 12:
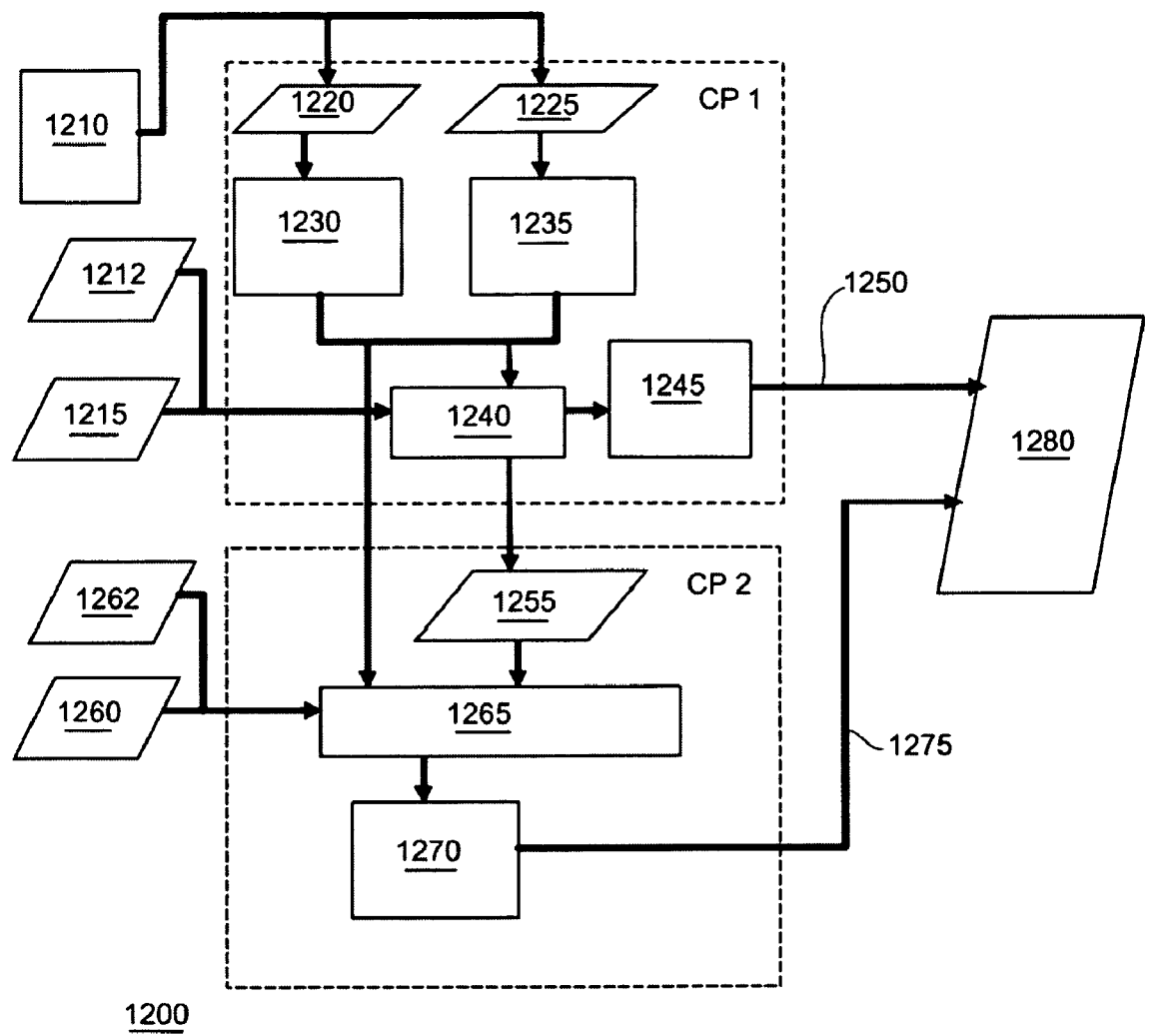
FIG. 12 shows a simplified sequence diagram for a method of operating a processing system in accordance with another embodiment of the invention.

FIG. 12 shows a simplified sequence diagram for a method of operating a processing system in accordance with another embodiment of the invention. In the illustrated embodiment, a cascading feed-forward and feedback wafer-to-wafer calculation sequence 1200 is shown, but this is not required for the invention. Alternately, the sequence 1200 can be lot-based or batch-based.

In the illustrated embodiment, the sequence 1200 includes two control plans, the first control plan CP1 and the second control plan CP2, but this is not required for the invention. Alternately, a different number of control plans may be used. For example, separate control plans may be used for isolated and nested conditions, and other control plans may also be used.

The first control plan CP1 can be coupled to a first input element 1210 and can include one or more data elements, such as 1220 and 1225. Alternately, a different number of input elements and/or data elements can be used. The data element 1220 can include "Iso" data and can include metrology data for at least one area on the wafer that comprises isolated structures/features, trenches, or vias, or combinations thereof. The data element 1225 can include "Nested" data and can include metrology data for at least one area on the wafer that comprises nested structures/features, trenches, or vias, or combinations thereof. Alternately, other data elements (not shown) can be included such as a "Reference", "Mixed", or "Nominal" data element.

The first input element 1210 can comprise ODP data from an integrated metrology module (IMM), such as an iODP module from Tokyo Electron Ltd. Alternately, the first input element 1210 may include SEM data and/or TEM data.

The first control plan CP1 can also include data conversion elements, such as 1230 and 1235. The data conversion element 1230 can be coupled to the data element 1220 and can be used to convert one or more of the data items in the data element 1220. For example, the data conversion element 1230 can be used to calibrate the "Iso" data to "CD-SEM" data. An equation and/or table can be established that relates the metrology data for "isolated" structures from one metrology module (IMM) to another metrology module (SEM). The data conversion element 1235 can be coupled to the data element 1225 and can be used to convert one or more of the data items in the data element 1225. For example, the data conversion element 1235 can be used to calibrate the "Nested" data to "CD-SEM" data. An equation and/or table can be established that relates the metrology data for "nested" structures from one metrology module (IMM) to another metrology module (SEM). One metrology module may be used to provide "Reference" data.

The second input element 1215 can be coupled to the first control plan CP1 and can comprise input data and/or output data for a process module in a processing tool, such as a TELIUS tool from Tokyo Electron Limited. Alternately, the second input element 1215 may include historical data. In one embodiment, the second input element 1215 can comprise a desired value for a process parameter, such as a "Bias Target".

The third input element 1212 can be coupled to the first control plan CP1 and can comprise feedback data and/or feed forward data for a process module in a processing tool, such as a TELIUS tool from Tokyo Electron Ltd. Alternately, the third input element 1212 may include historical data. In one embodiment, the third input element 1212 can comprise a difference (error value) between an actual value and a desired value for a process parameter, such as a "Bias Error".

In addition, the first control plan CP1 can include one or more computational elements, such as 1240 and 1245. The computational element 1240 can be coupled to the second input element 1215, the third input element 1212, the data conversion elements 1230, 1235, and to one or more other control plans. In one embodiment, the computational element 1240 can use feed-forward data and feedback data to compute one or more processing parameters. For example, in an etch process, one or more process parameters can be controlled to optimize the etch process for isolated and/or nested structures. In one case, the feed-forward data can include "Bias Target" data, the feedback data can include "Bias Error" data, and the process parameter can include an etch amount, such as a "Bias Trim" value.

The computational element 1245 can be coupled to the computational element 1240, and can provide one or more outputs 1250. In one embodiment, the computational element 1245 can be used to compute one or more recipe parameters, and the outputs 1250 may include "step time" data for one or more process steps. Alternately, the outputs 1250 may include other process data and/or tool data.

A fourth input element 1260 and a fifth input element 1262 can be coupled to the second control plan CP2 and can comprise input data and/or output data for a process module in a processing tool, such as a TELIUS tool from Tokyo Electron Limited. Alternately, the fourth and/or fifth input elements 1260, 1262 may include historical data. In one embodiment, the fourth input element 1260 can comprise feed-forward data such as a desired value for a process result, and the fifth input element 1262 can comprise feedback data such as error data for a process result. For example, error data can include a "BARC Error".

The second control plan CP2 can be coupled to one or more other control plans, such as the first control plan CP1, and can include one or more data elements, such as 1255. Alternately, a different number of control plans and/or data elements can be used. The data element 1255 can comprise calculated data, such as "Bias Trim" data and/or "Step Time" data. Alternately, the data element 1255 may include other feed-forward and/or feedback data items.

In addition, the second control plan CP2 can include one or more computational elements, such as 1265 and 1270. The computational element 1265 can be coupled to the third input element 1260, the data element 1255 and to one or more other computational elements, such as 1270. In one embodiment, the computational element 1265 can be used to compute one or more processing parameters. For example, in an etch process, one or more process parameters can be controlled to optimize the etch process for isolated and/or nested structures. In one case, the process parameter may be a "BARC Trim".

The computational element 1270 can be coupled to computational element 1265, and can provide one or more outputs 1275. In one embodiment, the computational element 1270 can be used to compute one or more recipe parameters, and the output 1275 may include flow data for one or more process gasses or one or more flow ratios for the process gasses. For example, a flow ratio can be provided for $O_2$ and $CF_4$. Alternately, the outputs 1275 may include other process data and/or tool data.

The sequence 1200 can also comprise a control strategy element 1280. One or more system controllers (not shown) can contain a number of APC Recipes (Control Strategies) for controlling the operation of the system, and a control Strategy can be associated with a system recipe for a processing tool.

In one embodiment, a BARC control strategy can be used to establish one or more BARC recipes to control one or more BARC etch processes. The BARC control strategy can include one or more "Iso/Nested" control plans, such as the first control plan CP1 and the second control plan CP2. A processing module and/or measurement module can have at least one control plan defined for each visit to the module. Control plans can contain models, limits, targets, recipes, and can cover multiple process steps within a process sequence. In one embodiment, an "Iso/Nested" control strategy and/or plan can be established and mapped to a module. Control strategies and/or plans can be established when a Process Job (PJ) is received and/or created.

Figure 13:
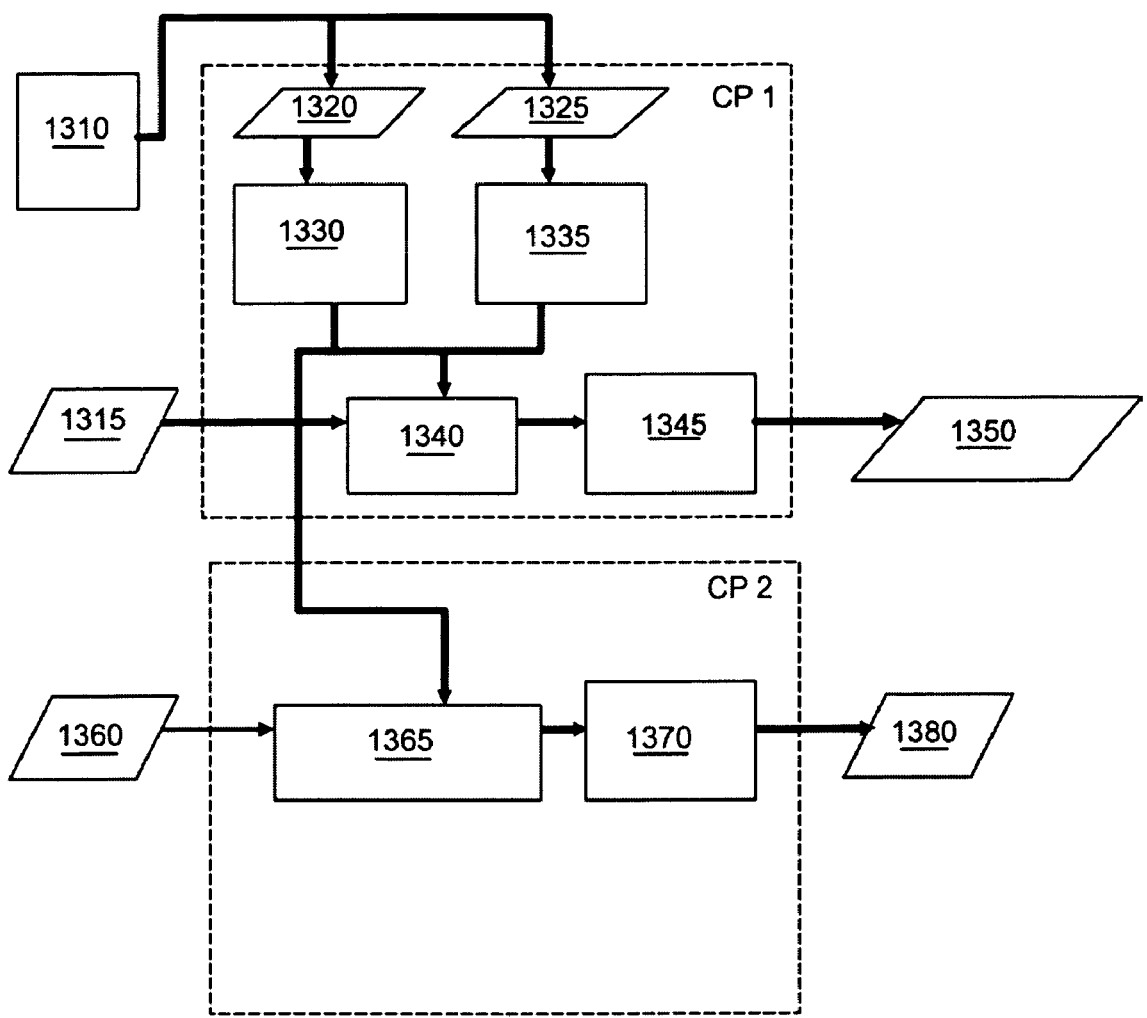
FIG. 13 shows a simplified sequence diagram for a method of operating a processing system in accordance with another embodiment of the invention.

FIG. 13 shows a simplified sequence diagram for method of operating a processing system in accordance with another embodiment of the invention. In the illustrated embodiment, a "post measurement calculation with process models updates" sequence 1300 is shown, but this is not required for the invention. Alternately, the sequence 1300 can be a different sequence.

In the illustrated embodiment, the sequence 1300 includes two control plans, a first control plan CP1 and a second control plan CP2, but this is not required for the invention. Alternately, a different number of control plans may be used. For example, separate control plans may be used for isolated and nested conditions, and other control plans may also be used.

The first control plan CP1 can be coupled to a first input element 1310 and can include one or more data elements, such as 1320 and 1325. Alternately, a different number of input elements and/or data elements can be used. The data element 1320 can include "Iso" data and can include metrology data for at least one area on the wafer that comprises isolated structures/features, trenches, or vias, or combinations thereof. The data element 1325 can include "Nested" data and can include metrology data for at least one area on the wafer that comprises nested structures/features, trenches, or vias, or combinations thereof. Alternately, other data elements (not shown) can be included such as a "Reference", "Mixed", or "Nominal" data element.

The first input element 1310 can comprise ODP data from an integrated metrology module (IMM), such as an iODP module from Tokyo Electron Ltd. Alternately, the first input element 1310 may include SEM data and/or TEM data.

The first control plan CP1 can also include data conversion elements, such as 1330 and 1335. The data conversion element 1330 can be coupled to the data element 1320 and the second control plan CP2, and the data conversion element 1330 can be used to convert one or more of the data items received from the data element 1320. For example, the data conversion element 1330 can be used to calibrate the "Iso" data to "CD-SEM" data. An equation and/or table can be established that relates the metrology data for "isolated" structures from one metrology module (IMM) to another metrology module (SEM). The data conversion element 1335 can be coupled to the data element 1325 and the second control plan CP2, and the data conversion element 1335 and can be used to convert one or more of the data items in the data element 1325. For example, the data conversion element 1335 can be used to calibrate the "Nested" data to "CD-SEM" data. An equation and/or table can be established that relates the metrology data for "nested" structures from one metrology module (IMM) to another metrology module (SEM). Alternately, "Reference" data may be used. In addition, the data conversion element 1330, and the data conversion element 1335 can be coupled to one or more other control plans.

The second input element 1315 can be coupled to the first control plan CP1 and can comprise input data and/or output data for a process module in a processing tool, such as a TELIUS tool from Tokyo Electron Limited. Alternately, the second input element 1315 may include historical data. In one embodiment, the second input element 1315 can comprise a desired value for a process parameter, such as a "Bias Target".

In addition, the first control plan CP1 can include one or more computational elements, such as 1340 and 1345. The computational element 1340 can be coupled to the second input element 1315, the data conversion elements 1330, 1335, and the computational element 1345. In one embodiment, the computational element 1340 can be used to compute one or more processing parameters. For example, in an etch process, one or more process parameters can be controlled to optimize the etch process for isolated and/or nested structures. In one case, the process parameter may be a "Bias Error".

The computational element 1345 can be coupled to the computational element 1340, and can provide one or more outputs 1350. In one embodiment, the computational element 1345 can be used to update one or more process models, and the output 1350 can include "Isolated" model data, "Nested" model data, or "Iso/Nested" model data, or combinations thereof. Alternately, the output 1350 may include updated model data.

A third input element 1360 can be coupled to the second control plan CP2 and can comprise input data and/or output data for a process module in a processing tool, such as a TELIUS tool from Tokyo Electron Ltd. Alternately, the third input element 1360 may include historical data. In one embodiment, the third input element 1360 can comprise a desired value for a process result, such as a "Final CD Target".

The second control plan CP2 can be coupled to one or more other control plans, such as the first control plan CP1, and can include one or more computational elements, such as 1365 and 1370. Alternately, a different number of control plans and/or computational elements can be used. The computational element 1365 can be coupled to the third input element 1360, another control plan, and to one or more computational elements, such as 1370. In one embodiment, the computational element 1365 can be used to compute one or more processing parameters. For example, in an etch process, one or more process parameters can be controlled to optimize the etch process for isolated and/or nested structures. In one case, the process parameter may be a "BARC Trim Error", and the output element can include a "Trim Error". Alternately, the output may include other process data and/or tool data.

The computational element 1370 can be coupled to the computational element 1365, and can provide one or more outputs 1380. In one embodiment, the computational element 1370 can be used to update one or more process models, and the output 1380 can include "Etch" model data, or "Trim" model data, or combinations thereof. Alternately, the output 1380 may include updated model data.

Figure 14:
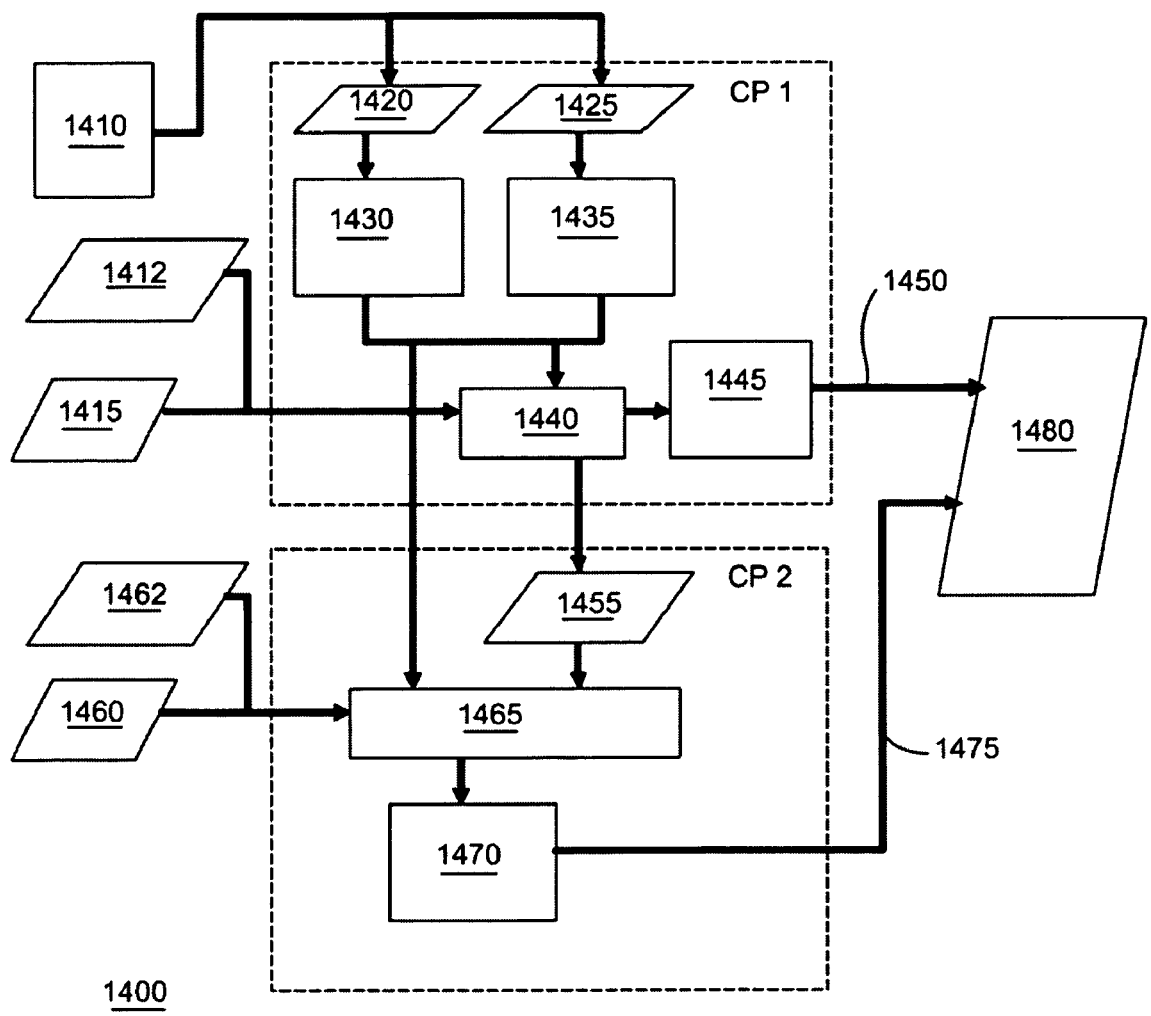
FIG. 14 shows a simplified sequence diagram for a method of operating a processing system in accordance with another embodiment of the invention.

FIG. 14 shows a simplified sequence diagram for a method of operating a processing system in accordance with another embodiment of the invention. In the illustrated embodiment, a "Cascading feed-forward wafer-to-wafer calculation with feedback model adjustment" sequence 1400 is shown, but this is not required for the invention. Alternately, the sequence can be lot-based or batch-based.

In the illustrated embodiment, the sequence 1400 includes two control plans, the first control plan CP1 and the second control plan CP2, but this is not required for the invention. Alternately, a different number of control plans may be used. For example, separate control plans may be used for isolated and nested conditions, and other control plans may also be used.

The first input element 1410 can comprise ODP data from an integrated metrology module (IMM), such as an iODP module from Tokyo Electron Ltd. Alternately, the first input element 1410 may include SEM data and/or TEM data.

The first control plan CP1 can also include data conversion elements, such as 1430 and 1435. The data conversion element 1430 can be coupled to a data element 1420 and the second control plan CP2, and the data conversion element 1430 can be used to convert one or more of the data items received from the data element 1420. For example, the data conversion element 1430 can be used to calibrate the "Iso" data to "CD-SEM" data. An equation and/or table can be established that relates the metrology data for "isolated" structures from one metrology module (IMM) to another metrology module (SEM). The data conversion element 1435 can be coupled to a data element 1425 and the second control plan CP2, and the data conversion element 1435 and can be used to convert one or more of the data items in the data element 1425. For example, the data conversion element 1435 can be used to calibrate the "Nested" data to "CD-SEM" data. An equation and/or table can be established that relates the metrology data for "nested" structures from one metrology module (IMM) to another metrology module (SEM). Alternately, "Reference" data may be used. In addition, the data conversion element 1430 and the data conversion element 1435 can be coupled to one or more other control plans.

The second input element 1415 can be coupled to the first control plan CP1 and can comprise input data and/or output data for a process module in a processing tool, such as a TELIUS tool from Tokyo Electron Ltd. Alternately, the second input element 1415 may include historical data. In one embodiment, the second input element 1415 can comprise a desired value for a process parameter, such as a "Bias Target".

The third input element 1412 can be coupled to the first control plan CP1 and can comprise feedback data and/or feed-forward data for a process module in a processing tool, such as a TELIUS tool from Tokyo Electron Ltd. Alternately, the third input element 1412 may include historical data. In one embodiment, the third input element 1412 can comprise a process model data, such as "Iso/Nested" model data.

In addition, the first control plan CP1 can include one or more computational elements, such as 1440 and 1445. The computational element 1440 can be coupled to the second input element 1415, the third input element 1412, the data conversion elements 1430, 1435, and to one or more other control plans. In one embodiment, the computational element 1440 can use feed-forward data and feedback data to compute one or more processing parameters. For example, in an etch process, a process model can be used to optimize the etch process for isolated and/or nested structures. In one case, the feed forward data can include "Bias Target" data, the feedback data can include "IsoNested" model data, and the process parameter can include an etch amount, such as a "Bias Trim" value.

The computational element 1445 can be coupled to the computational element 1440 and can provide one or more outputs 1450. In one embodiment, the computational element 1445 can be used to compute one or more recipe parameters, and the outputs 1450 may include "step time" data for one or more process steps. Alternately, the outputs 1450 may include other process data and/or tool data.

A fourth input element 1460 and a fifth input element 1462 can be coupled to the second control plan CP2 and can comprise input data and/or output data for a process module in a processing tool, such as a TELIUS tool from Tokyo Electron Ltd. Alternately, the fourth and/or fifth input elements 1460, 1462 may include historical data. In one embodiment, the fourth input element 1460 can comprise feed-forward data such as a desired value for a process result, and the fifth input element 1462 can comprise feedback data such as model data and/or model update data. For example, model data can include "Trim" model data.

The second control plan CP2 can be coupled to one or more other control plans, such as the first control plan CP1, and can include one or more data elements, such as 1455. Alternately, a different number of control plans and/or data elements can be used. The data element 1455 can comprise calculated data, such as "Bias Trim" data and/or "Step Time" data. Alternately, the data element 1455 may include other feed-forward and/or feedback data items.

In addition, the second control plan CP2 can include one or more computational elements, such as 1465 and 1470. The computational element 1465 can be coupled to one or more input elements, such as 1460 and 1462, the data element 1455 and to one or more other computational elements, such as 1470. In one embodiment, the computational element 1465 can be used to compute one or more processing parameters. For example, in an etch process, one or more process parameters can be controlled to optimize the etch process for isolated and/or nested structures. In one case, the process parameter may be a "BARC Trim".

The computational element 1470 can be coupled to the computational element 1465, and can provide one or more outputs 1475. In one embodiment, the computational element 1470 can be used to compute one or more recipe parameters, and the output 1475 may include flow data for one or more process gasses or one or more flow ratios for the process gasses. For example, a flow ratio can be provided for $O_2$ and $CF_4$. Alternately, the output 1475 may include other process data and/or tool data.

The sequence 1400 can also comprise a control strategy element 1480. One or more system controllers (not shown) can contain a number of APC Recipes (Control Strategies) for controlling the operation of the system, and a control strategy can be associated with a system recipe for a processing tool.

In one embodiment, a BARC control strategy can be used to establish one or more BARC recipes to control one or more BARC etch processes. The BARC control strategy can include one or more "Iso/Nested" control plans, such as the first control plan CP1 and the second control plan CP2. A processing module and/or measurement module can have at least one control plan defined for each visit to the module. Control plans can contain models, limits, targets, recipes, and can cover multiple process steps within a process sequence. In one embodiment, an "Iso/Nested" control strategy and/or plan can be established and mapped to a module. Control strategies and/or plans can be established when a Process Job (PJ) is received and/or created.

Figure 15:
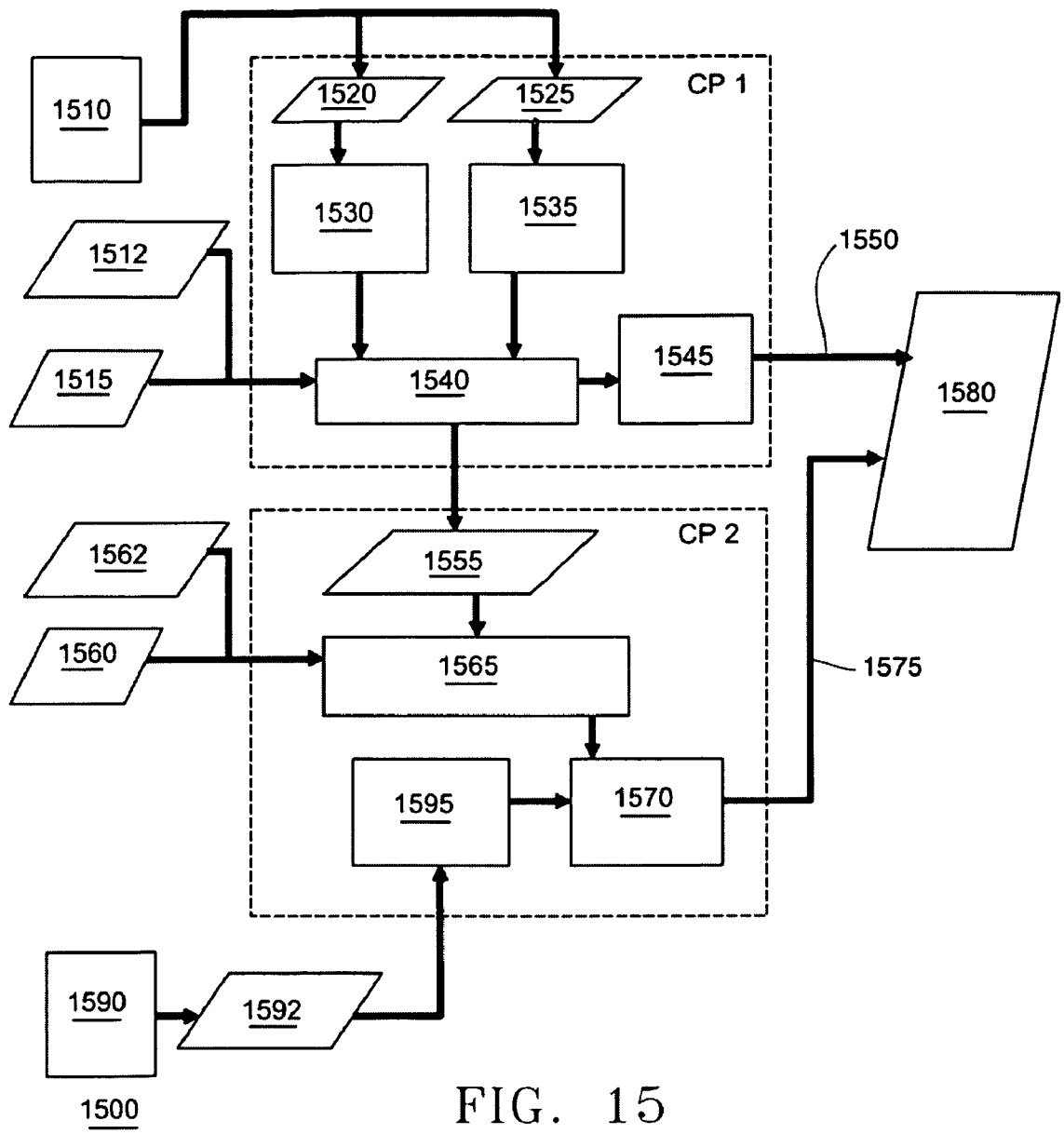
FIG. 15 shows a simplified sequence diagram for a method of operating a processing system in accordance with another embodiment of the invention.

FIG. 15 shows a simplified sequence diagram for a method of operating a processing system in accordance with another embodiment of the invention. In the illustrated embodiment, another cascading feed-forward wafer-to-wafer calculation sequence 1500 is shown with a different structure for the trim control, but this is not required for the invention. Alternately, the sequence can be lot-based or batch-based.

In the illustrated embodiment, the sequence 1500 includes two control plans, the first control plan CP1 and the second control plan CP2, but this is not required for the invention. Alternately, a different number of control plans may be used. For example, separate control plans may be used for isolated and nested conditions, and other control plans may also be used.

The first input element 1510 can comprise ODP data from an integrated metrology module (IMM), such as an iODP module from Tokyo Electron Ltd. Alternately, the first input element 1510 may include SEM data and/or TEM data.

The first control plan CP1 can also include data conversion elements, such as 1530 and 1535. The data conversion element 1530 can be coupled to a data element 1520, and the data conversion element 1530 can be used to convert one or more of the data items received from the data element 1520. For example, the data conversion element 1530 can be used to calibrate the "Iso" data to "CD-SEM" data. An equation and/or table can be established that relates the metrology data for "isolated" structures from one metrology module (IMM) to another metrology module (SEM). The data conversion element 1535 can be coupled to a data element 1525, and the data conversion element 1535 and can be used to convert one or more of the data items in the data element 1525. For example, the data conversion element 1535 can be used to calibrate the "Nested" data to "CD-SEM" data. An equation and/or table can be established that relates the metrology data for "nested" structures from one metrology module (IMM) to another metrology module (SEM). Alternately, "Reference" data may be used. In addition, the data conversion element 1530 and the data conversion element 1535 may be coupled to one or more other control plans.

The second input element 1515 can be coupled to the first control plan CP1 and can comprise input data and/or output data for a process module in a processing tool, such as a TELIUS tool from Tokyo Electron Ltd. Alternately, the second input element 1515 may include historical data. In one embodiment, the second input element 1515 can comprise a desired value for a process parameter, such as a "Bias Target".

The third input element 1512 can be coupled to the first control plan CP1 and can comprise feedback data and/or feed-forward data for a process module in a processing tool, such as a TELIUS tool from Tokyo Electron Ltd. Alternately, the third input element 1512 may include historical data. In one embodiment, the third input element 1512 can comprise a process model data, such as "Iso/Nested" model data.

In addition, the first control plan CP1 can include one or more computational elements, such as 1540 and 1545. The computational element 1540 can be coupled to the second input element 1515, the third input element 1512, the data conversion elements 1530, 1535, and to one or more other control plans. In one embodiment, the computational element 1540 can use feed forward data and feedback data to compute one or more processing parameters. For example, in an etch process, a process model can be used to optimize the etch process for isolated and/or nested structures. In one case, the feed-forward data can include "Bias Target" data, the feedback data can include "Iso/Nested" model data, and the process parameter can include an etch amount, such as a "Bias Trim" value and/or a "Step Time" value.

The computational element 1545 can be coupled to the computational element 1540, and can provide one or more outputs 1550. In one embodiment, the computational element 1545 can be used to compute one or more recipe parameters, and the outputs 1550 may include "step time"

data for one or more process steps. Alternately, the outputs 1550 may include other process data and/or tool data.

A fourth input element 1560 and a fifth input element 1562 can be coupled to the second control plan CP2 and can comprise input data and/or output data for a process module in a processing tool, such as a TELIUS tool from Tokyo Electron Ltd. Alternately, the fourth and/or fifth input elements 1560, 1562 may include historical data. In one embodiment, the fourth input element 1560 can comprise feed-forward data such as a desired value for a process result (i.e., final CD target), and the fifth input element 1562 can comprise feedback data such as model data and/or model update data. For example, model data can include "Trim" model data.

The second control plan CP2 can be coupled to one or more other control plans, such as the first control plan CP1, and can include one or more data elements, such as 1555. Alternately, a different number of control plans and/or data elements can be used. The data element 1555 can comprise calculated data, such as "Bias Trim" data and/or "Step Time" data. Alternately, the data element 1555 may include other feed forward and/or feedback data items.

In addition, the second control plan CP2 can include one or more computational elements, such as 1565, 1570. The computational element 1565 can be coupled to the fourth input element 1560, the fifth input element 1562, the data element 1555 and to one or more other computational elements, such as 1570. In one embodiment, the computational element 1565 can be used to compute one or more processing parameters. For example, in an etch process, one or more process parameters can be controlled to optimize the etch process for isolated and/or nested structures. In one case, the process parameter may be a "BARC Trim".

The computational element 1570 can be coupled to the computational element 1565, and can provide one or more outputs 1575. In one embodiment, the computational element 1570 can be used to compute one or more recipe parameters, and the output 1575 may include flow data for one or more process gasses or one or more flow ratios for the process gasses. For example, a flow ratio can be provided for $O_2$ and $CF_4$. Alternately, the outputs 1575 may include other process data and/or tool data.

The second control plan CP2 can also include data conversion elements, such as 1595. The data conversion element 1595 can be coupled to the control element 1592, and the data conversion element 1595 can be used to convert one or more of the data items received from the control element 1592. For example, the data conversion element 1595 can be used to calibrate the metrology data from one measurement system to a reference system data such as CD-SEM data. In addition, the control element 1592 can be coupled to an input element 1590 that can include metrology data.

The sequence 1500 can also comprise a control strategy element 1580. One or more system controllers (not shown) can contain a number of APC Recipes (Control Strategies) for controlling the operation of the system, and a control strategy can be associated with a system recipe for a processing tool.

In one embodiment, a BARC control strategy can be used to establish one or more BARC recipes to control one or more BARC etch processes. The BARC control strategy can include one or more "Iso/Nested" control plans, such as the first control plan CP1 and the second control plan CP2. A processing module and/or measurement module can have at least one control plan defined for each visit to the module. Control plans can contain models, limits, targets, recipes, and can cover multiple process steps within a process sequence. In one embodiment, an "Iso/Nested" control strategy and/or plan can be established and mapped to a module. Control strategies and/or plans can be established when a Process Job (PJ) is received and/or created.

Figure 16:
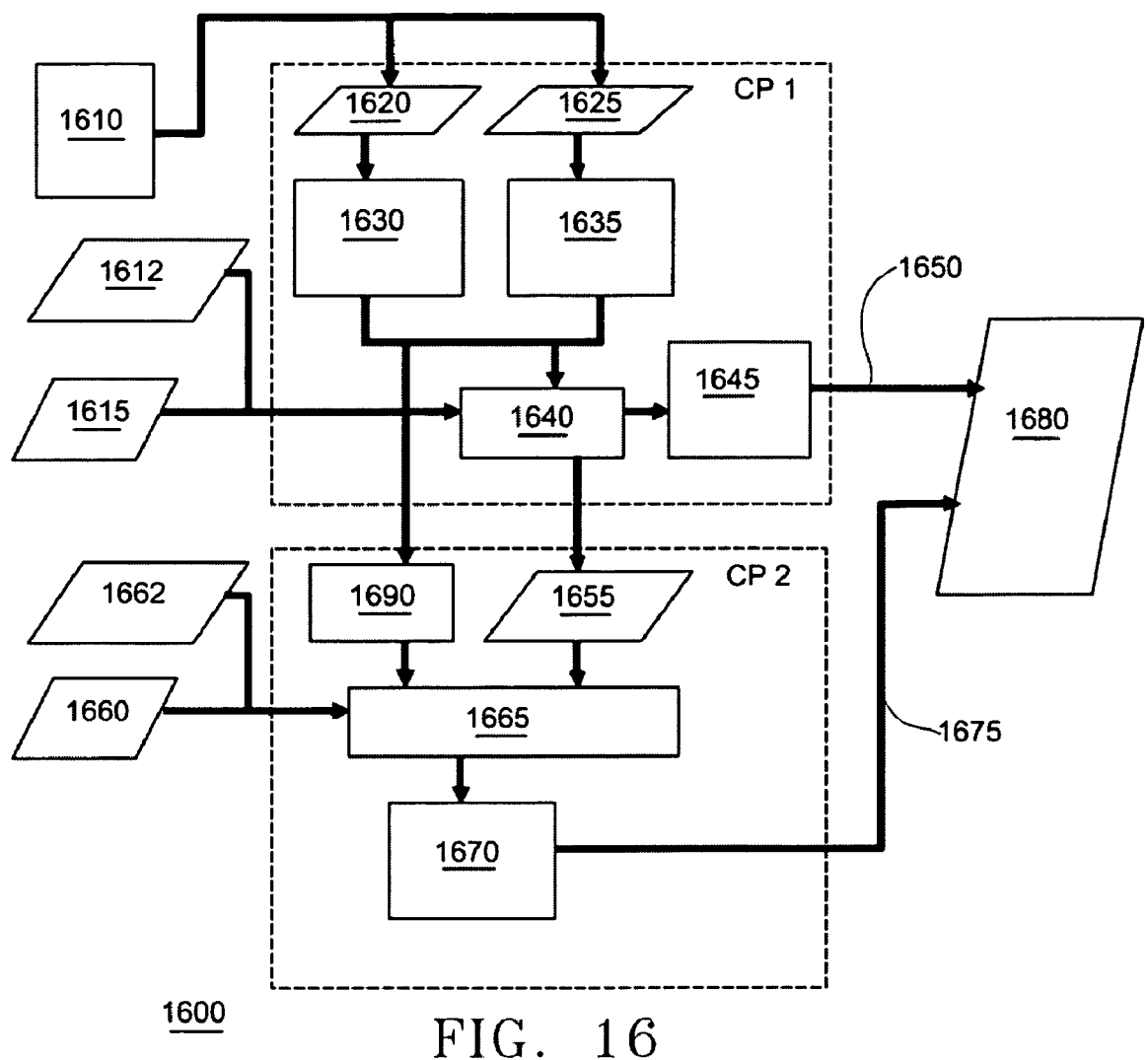
FIG. 16 shows a simplified sequence diagram for a method of operating a processing system in accordance with another embodiment of the invention.

FIG. 16 shows a simplified sequence diagram for a method of operating a processing system in accordance with another embodiment of the invention. In the illustrated embodiment, another cascading feed-forward wafer-to-wafer calculation sequence 1600 is shown that includes a virtual measurement, but this is not required for the invention. Alternately, the sequence can be lot-based or batch-based.

In the illustrated embodiment, the sequence 1600 includes two control plans, the first control plan CP1 and the second control plan CP2, but this is not required for the invention. Alternately, a different number of control plans may be used. For example, separate control plans may be used for isolated and nested conditions, and other control plans may also be used.

The first input element 1610 can comprise ODP data from an integrated metrology module (IMM), such as an iODP module from Tokyo Electron Ltd. Alternately, the first input element 1610 may include SEM data and/or TEM data.

The first control plan CP1 can also include data conversion elements, such as 1630 and 1635. The data conversion element 1630 can be coupled to the data element 1630 and the second control plan CP2, and the data conversion element 1630 can be used to convert one or more of the data items received from the data element 1620. For example, the data conversion element 1630 can be used to calibrate the "Iso" data to "CD-SEM" data. An equation and/or table can be established that relates the metrology data for "isolated" structures from one metrology module (IMM) to another metrology module (SEM). The conversion element 1635 can be coupled to the data element 1625 and the second control plan CP2, and the data conversion element 1635 and can be used to convert one or more of the data items in the data element 1625. For example, the data conversion element 1635 can be used to calibrate the "Nested" data to "CD-SEM" data. An equation and/or table can be established that relates the metrology data for "nested" structures from one metrology module (IMM) to another metrology module (SEM). Alternately, "Reference" data may be used. In addition, the data conversion element 1630 and the data conversion element 1635 can be coupled to one or more other control plans.

The second input element 1615 can be coupled to CP1 and can comprise input data and/or output data for a process module in a processing tool, such as a TELIUS tool from Tokyo Electron Ltd. Alternately, the second input element 1615 may include historical data. In one embodiment, the second input element 1615 can comprise a desired value for a process parameter, such as a "Bias Target".

The third input element 1612 can be coupled to the first control plan CP1 and can comprise feedback data and/or feed-forward data for a process module in a processing tool, such as a TELIUS tool from Tokyo Electron Ltd. Alternately, the third input element 1612 may include historical data. In one embodiment, the third input element 1612 can comprise a process model data, such as "Iso/Nested" model data.

In addition, the first control plan CP1 can include one or more computational elements, such as 1640 and 1645. The computational element 1640 can be coupled to the second input element 1615, the third input element 1612, the data conversion elements 1630, 1635, and to one or more other control plans. In one embodiment, the computational element 1640 can use feed forward data and feedback data to compute one or more processing parameters. For example, in an etch process, a process model can be used to optimize the etch process for isolated and/or nested structures. In one case, the feed-forward data can include "Bias Target" data, the feedback data can include "Iso/Nested" model data, and the process parameter can include an etch amount, such as a "Bias Trim" value.

The computational element 1645 can be coupled to the computational element 1640, and can provide one or more outputs 1650. In one embodiment, the computational element 1645 can be used to compute one or more recipe parameters, and the outputs 1650 may include "step time" data for one or more process steps. Alternately, the outputs 1650 may include other process data and/or tool data.

A fourth input element 1660 and a fifth input element 1662 can be coupled to the second control plan CP2 and can comprise input data and/or output data for a process module in a processing tool, such as a TELIUS tool from Tokyo Electron Ltd. Alternately, the fourth and/or fifth input elements 1660, 1662 may include historical data. In one embodiment, the fourth input element 1660 can comprise feed-forward data such as a desired value for a process result, and the fifth input element 1662 can comprise feedback data such as model data and/or model update data. For example, model data can include "Trim" model data.

The second control plan CP2 can be coupled to one or more other control plans, such as the first control plan CP1, and can include one or more data elements, such as 1655. Alternately, a different number of control plans and/or data elements can be used. The data element 1655 can comprise calculated data, such as "Bias Trim" data and/or "Step Time" data. Alternately, the data element 1655 may include other feed-forward and/or feedback data items.

In addition, the second control plan CP2 can include one or more computational elements, such as 1665 and 1670. The computational element 1665 can be coupled to one or more input elements, such as 1660 and 1662, the data element 1655 and to one or more other computational elements, such as 1670. In one embodiment, the computational element 1665 can be used to compute one or more processing parameters. For example, in an etch process, one or more process parameters can be controlled to optimize the etch process for isolated and/or nested structures. In one case, the process parameter may be a "BARC Trim".

The computational element 1670 can be coupled to the computational element 1665, and can provide one or more outputs 1675. In one embodiment, the computational element 1670 can be used to compute one or more recipe parameters, and the outputs 1675 may include flow data for one or more process gasses or one or more flow ratios for the process gasses. For example, a flow ratio can be provided for $O_2$ and $CF_4$. Alternately, the outputs 1675 may include other process data and/or tool data.

Furthermore, the second control plan CP2 can comprise an additional computational element 1690 that can coupled to the data conversion element 1630, the data conversion element 1635, and the computational element 1665. The computational element 1690 can be used to compute a virtual measurement.

The sequence 1600 can also comprise a control strategy element 1680. One or more system controllers (not shown) can contain a number of APC Recipes (Control Strategies) for controlling the operation of the system, and a control strategy can be associated with a system recipe for a processing tool.

In one embodiment, a BARC control strategy can be used to establish one or more BARC recipes to control one or more BARC etch processes. The BARC control strategy can include one or more "Iso/Nested" control plans, such as the first control plan CP1 and the second control plan CP2. A processing module and/or measurement module can have at least one control plan defined for each visit to the module. Control plans can contain models, limits, targets, recipes, and can cover multiple process steps within a process sequence. In one embodiment, an "Iso/Nested" control strategy and/or plan can be established and mapped to a module. Control strategies and/or plans can be established when a Process Job (PJ) is received and/or created.

The processing system can include controllers that can operate as a single input single output (SISO) devices, as a single input multiple output (SIMO) devices, as a multiple input single output (MISO) devices, and as a multiple input multiple output (MIMO) devices. In addition, inputs and outputs can be within a controller and/or between one or more controllers. For example, when multiple inputs such as CD and sidewall angle are being used, inputs and outputs can be fed forward and backward between two modules, (i.e., one for CD control and one for sidewall angle control). In addition, a mask open controller can also be used. In a multi-process case including multiple modules, information can be fed-forward or fed-back from one controller to another controller.

The previously described feed-forward and feedback sequences can be performed using multiple inputs and/or multiple outputs. The control plans, recipes, models, data elements, data conversion elements, computational elements, and/or control strategy elements can include multiple inputs and/or multiple outputs.

In one embodiment, the processing system and the host system co-operate to determine the correct process sequence to use to process a wafer. For example, in a trimming process such as a hard mask or a soft mask trim process, some wafers may require one pass through an etch module, and other wafers may require more than one pass through an etch module. In this case, the host system can allow the processing system to determine the number of passes through the etch module and control plans and/or strategies can be established to manage the different number of process objects in the process sequences for the different wafers.

A system controller can create a control strategy that can comprise one or more control plans for a wafer using one or more desired results received from the host system. In one embodiment, an "Iso/Nested" control strategy can be created that can comprise "Iso" and "Nested" control plans. Alternately, an "Iso/Nested" system recipe may be created. The "Iso/Nested" control strategy selection and initiation can be context-based. When an "Iso/Nested" control strategy is executed, a wafer can be processed in one or more modules.

In addition, a system controller can execute an "Iso/Nested" data collection (DC) strategy, and the "Iso/Nested" data collection (DC) strategy can comprise at least one data collection (DC) plan. The "Iso/Nested" DC strategy selection and initiation can also be context-based. When an "Iso/Nested" DC strategy is executed, "Iso" and/or "Nested" data can be collected for a wafer that is being processed.

Furthermore, a system controller can execute an "Iso/Nested" analysis strategy when a wafer is processed. The "Iso/Nested" analysis strategy can comprise an "Iso/Nested" analysis plan, or an "Iso/Nested" judgment plan, or a combination thereof. When an "Iso/Nested" analysis strategy is executed, wafer data, process data, and/or module data can be analyzed, and fault conditions can be identified. Alternately, feedback data can be computed and used to update a process recipe and/or a process model.

In one embodiment, the processing system controller can determine a control strategy (recipe) for each element in a process sequence. Alternately, a control strategy (recipe) may be determined, sent, and/or verified by the host system.

Figure 17:
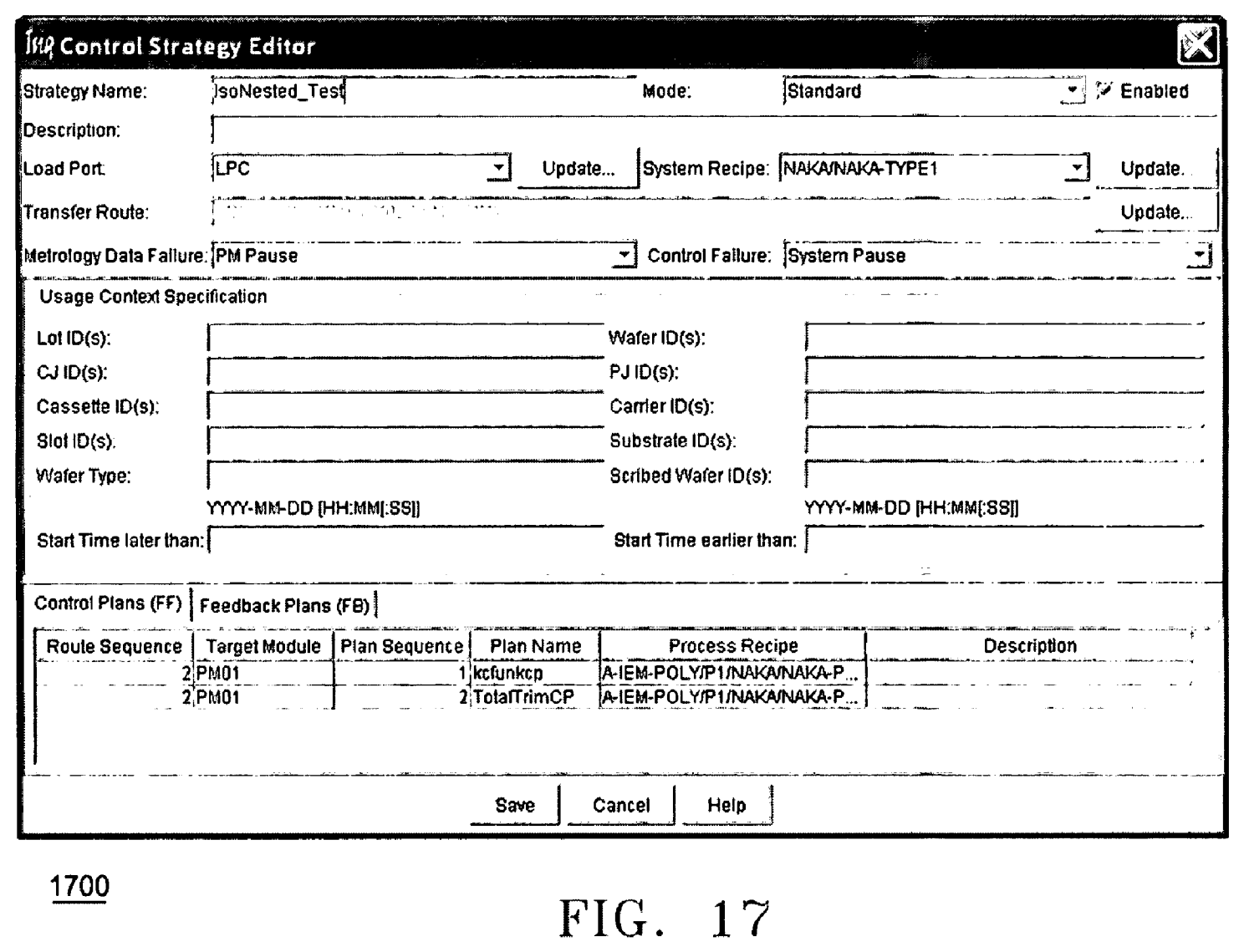

FIG. 17 illustrates an exemplary view of an Iso/Nested Control Strategy Screen 1700 in accordance with an embodiment of the invention. The Iso/Nested Control Strategy Screen 1700 can comprise a number of configuration items. Using the Iso/Nested Control Strategy Screen 1700, a user can perform an Iso/Nested Control Strategy configuration, view an existing Iso/Nested Control Strategy, create a new Iso/Nested Control Strategy, copy an existing Iso/Nested Control Strategy, edit an existing Iso/Nested Control Strategy, delete an existing Iso/Nested Control Strategy, and test an Iso/Nested Control Strategy. For example, a drop-down list can be used to select a course of action.

Figure 18:
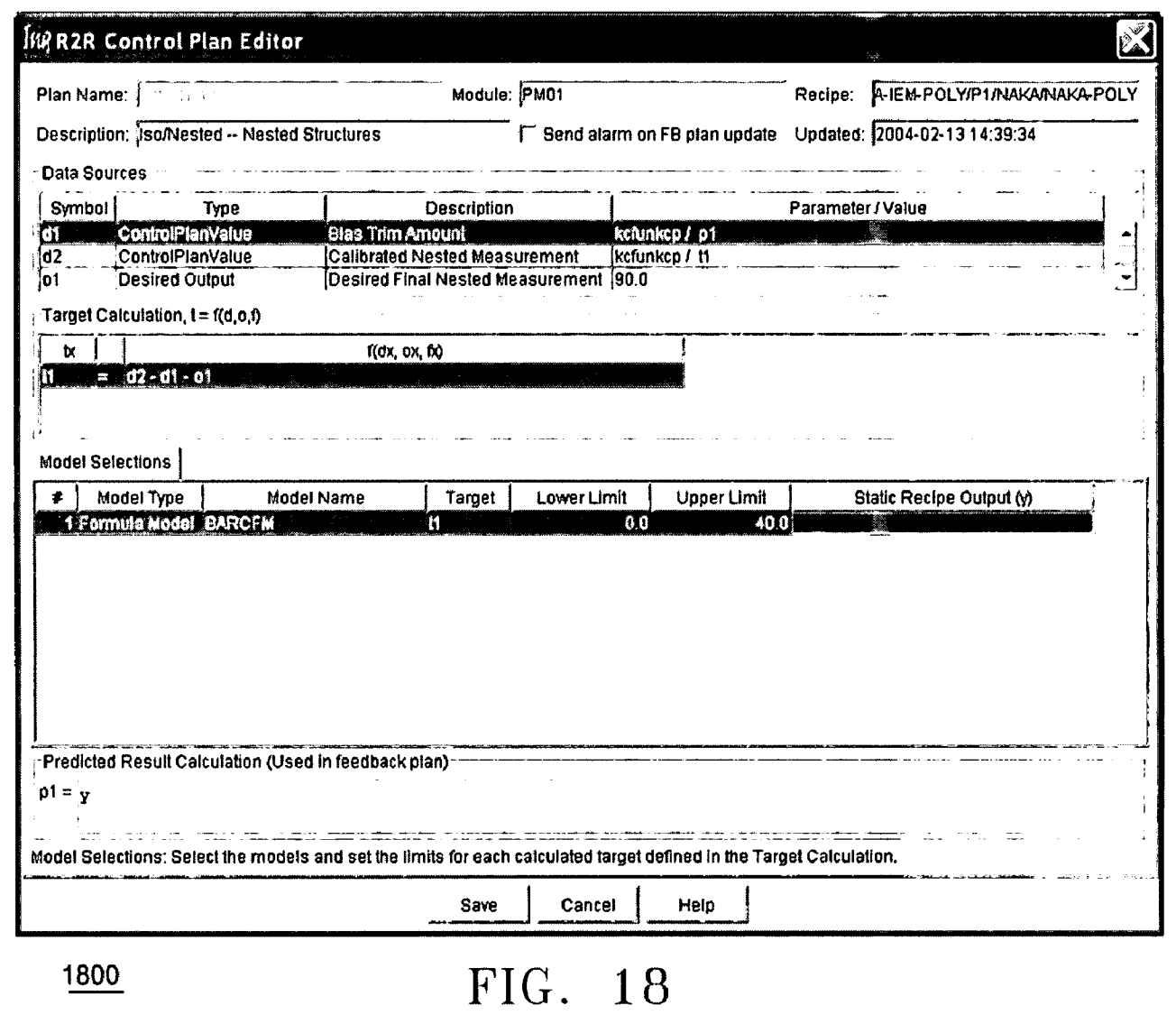

FIG. 18 illustrates an exemplary view of a Nested Control Plan Editor Screen 1800 in accordance with an embodiment of the invention.

Figure 19:
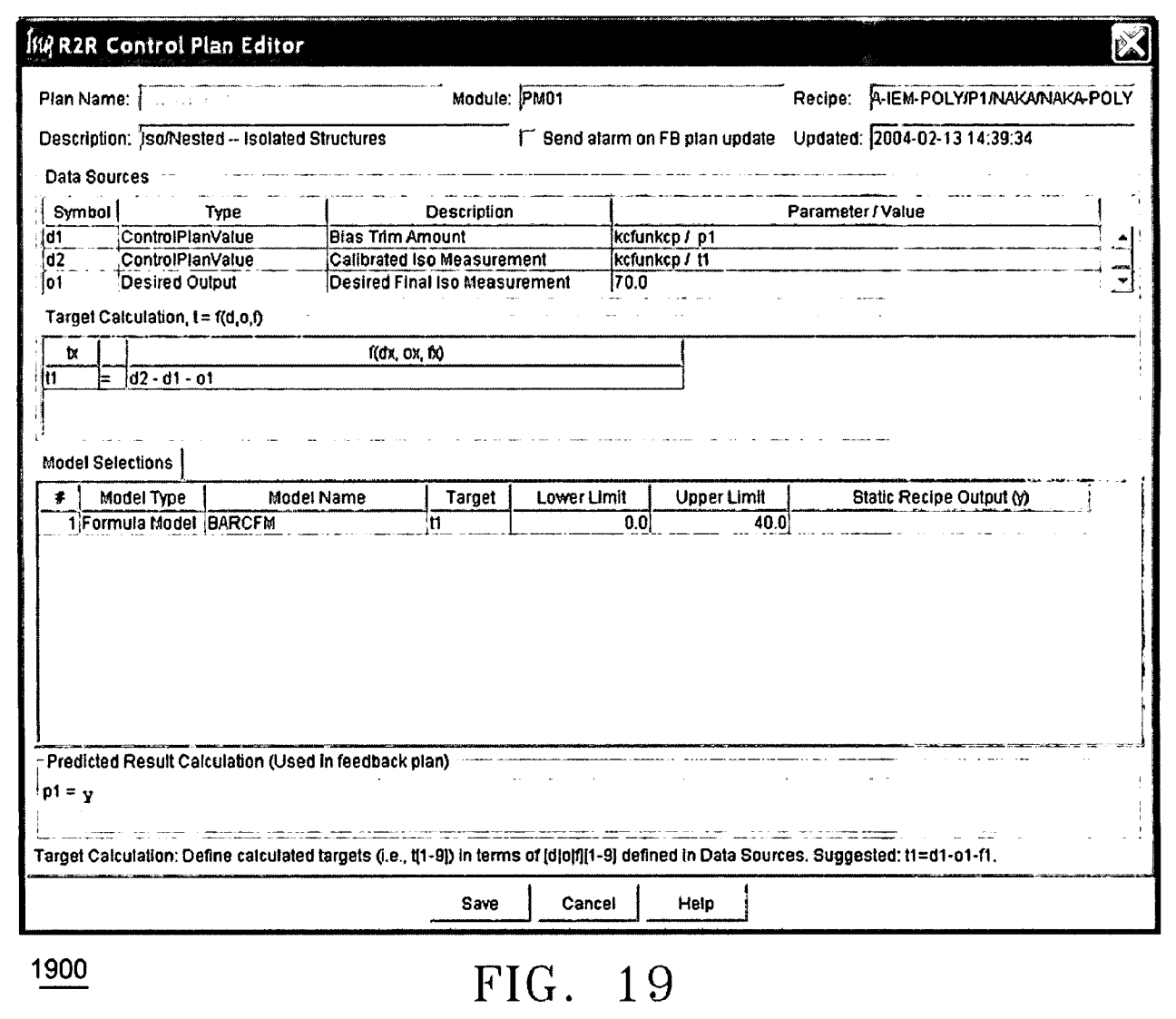

FIG. 19 illustrates an exemplary view of an Isolated Control Plan Editor Screen 1900 in accordance with an embodiment of the invention. Alternately, other plans can be used.

To create a Nested and/or Isolated Control Plan, a user can select the plan name item and select a new Control Plan or an existing plan or model. For example, on an Iso/Nested Control Strategy screen, a drop-down menu can appear and the Add Plan selection (not shown) can be chosen.

A Nested and/or Isolated Control Plan Editor Screen 1800, 1900 can comprise a number of fields. The Plan Name field can be used to enter/edit a name for a Nested and/or Isolated control plan. A Module field can be used to enter/edit a module name. For example, if the plan is associated with a strategy, the module field may be automatically filled in. If the plan is unassociated, the module field can be used to select a process module or a measurement module. The Recipe field can be used to enter/edit a recipe. For example, if the plan is associated with a strategy, the recipe field may be automatically filled in. If the plan is unassociated, the field can be used to select a process recipe for a process module or a measurement recipe for a measurement module.

The Description field can be used to enter/edit a description for the plan. The Updated field displays the last time the plan was changed.

The Data Sources table can be used to enter/edit a data source. For example, a Nested and/or Isolated Plan Data Source screen may be opened. The Data source table can include a source type, a data source description, and a data source parameter/value. For example, the selected source type determines the options displayed on the Data Source screen; a "Telius ODP" type can be used to define integrated metrology module data sources that are part of the processing tool; a "Desired Output" type allows the user to enter a fixed unit for the controller; a "Feedback Offset" type allows the user to define a persistent feedback variable; a "Control Plan Value" allows the user to create a variable that references the results of a different control plan (creates nested plans); the "Integrated Metrology Site Filtering" type creates tables with descriptions of each option when each data source is selected; and a "ContextItem" type allows a user to create a variable that references a context item, such as a Slot_Id, a Wafer_id, or a wafer number.

The symbol can be selected from the Symbol drop-down list, and a source type can be selected from the Data Source Type drop-down menu. For example, the data source information fields can vary depending on the chosen data source.

Three input data sources (d1, d2, o1) are shown, but this is not required. A different number of input data sources can be used, and each input data source can have a different symbol value. A data source can be a control plan value such as a desired process result or a calibrated date item. In addition, a data source can be an ODP tool, and it can be part of the processing tool, such as a Telius. Furthermore, another data source can be a SEM, and the Parameter/Value can be actual measured data such as a CD-SEM data.

In general, process control can include updating a process module recipe using metrology information measured on the wafer prior to its arrival in the process module. The controller can use the pre-processing data to determine how many visits are required to the various physical modules. The desired process result can be a "y" value in a model equation. The task is determine when the desired process result "y" is the correct value.

In the target calculation field, on a Nested and/or Isolated Control Plan screen, the target calculation can be entered. For example, the target calculation can be set equal to the data source item. Alternately, an equation may be entered that correlates one set of data with another set of data. In addition, target calculation may comprise an additional compensation term. For example, the additional compensation factor can be used to correct for errors introduced in another step, such as a photo resist step. A new target value can be a variable that is calculated at or before run time, and an equation can be used to calculate the target value.

In addition, new lower and upper limit values can be used, and these values can be entered in the lower limit field and upper limit field. For example, the new lower and upper limit values can be constants or variables that are calculated at or before run time, and equations can be used to calculate the new lower and upper limit values.

The Model Selections field can be used to edit/enter a static model and/or a formula model. For example, under the model type selection item, a selection item in the table can be used to enter and/or edit a model type. A drop down list can be activated from the table item and a selection can be made from the drop down list. One option in the drop down list allows a new model to be created; other options can be used to display and select existing models to use or to modify. Each model type can have a module name, target value, lower limit, upper limit, and recipe output associated with it. When creating a new model, a new model type can be used and entered in the model type field, and a new model name can be used and entered in the model name field.

The Predicted Result Calculation field can be used to enter a new predicted result value or select an existing predicted result value. The predicted result value can be an equation for the expected result. For example, a Control Plan can be saved when Name, Target Calculation, and Model Selection information is entered.

The # field comprises a number of the model in the list of models. The model type allows either a Static or a Formula model to be selected. The Model Name field lists the names of available models. For example, to create a new model, a "New Static Recipe" option or a "New Formula Recipe" option can be selected from a drop down list. A static control plan can be created that comprises one or more static recipes. For example, ten or more static models can be shown. The static models are shown with the same target value (t1), but this is not required. A different number of static and/or formula models can be used, and each model can have a different target value. A new target value can be calculated when each static recipe is used. The static recipe models can have different operating ranges as defined by the lower limit values and the upper limit values. In addition, the static recipe models can have different static recipe outputs, and a different static recipe output can be determined for each static recipe.

The Nested and/or Isolated control plan can include a static model recipe, or a formula model recipe, or a combination thereof. The controller can auto-generate control plans for modules. A process recipe can comprise one or more processes each comprising one or more processing steps. The process recipe can be performed in a single chamber or multiple chambers. The process recipe can be configured using at least one of a nominal recipe, a static recipe, and a formula model.

A static recipe can be a single set of recipe adjustments that are used to achieve a specific process result. A set of static recipes can be used to set up a table-based controller, or static recipes can be used along with formula models to treat ranges of the desired output where the same recipe should be used. When using feedback with static recipes, a single predicted process result can be specified in the control plan for each static recipe used.

Figure 20:
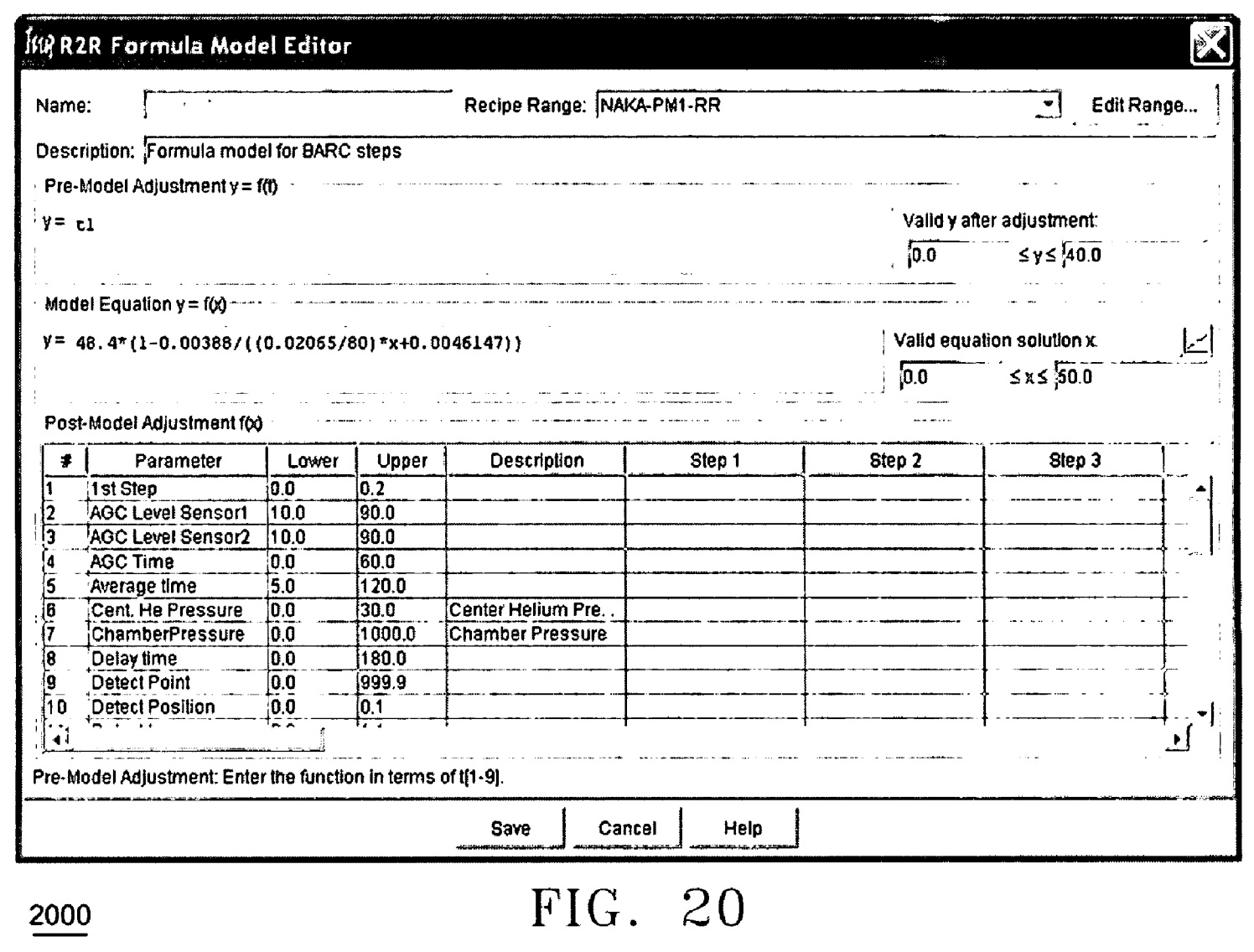

FIG. 20 illustrates an exemplary view of a Formula Model Editor Screen 2000 in accordance with an embodiment of the invention. A formula model can comprise a pre-model adjustment, a model equation, a series of post model adjustments, and a recipe parameter assignment map. The pre-model adjustment can allow the re-expression of the desired process result (usually t1) into the correct units that are used in a model equation (resulting in a value of y), and the model equation can be an expression that calculates the predicted process result as a function of one manipulated variable (x). When the model is executed, it will solve for x given the re-expressed desired process result (y). Once x is determined, the post model adjustments can be calculated, and their values will be assigned to the appropriate recipe parameters specified in the recipe parameter map.

In addition, one or more process models can be provided. A process model can be used to define a process space. A process model represents the verified relationship between the desired results (outputs) and the received variables needed to achieve those results. Process models can include equations that can include formula-based models. Formula-based models can comprise equations that contain the piece-wise associations of desired results with recipe variables based on some evaluated experimental data. A process model can be linear or non-linear. A process model can be used to verify a new process recipe, and update an existing process recipe.

As would be appreciated by those skilled in the art, the various components described herein may be connected to one another via a wired or a wireless connection or via the Internet. None of the connections, therefore, should be viewed as being any one particular variety or type.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

What is claimed is:

1. A method of operating a semiconductor processing system comprising:
    receiving, by the semiconductor processing system, input data comprising reference metrology data for a wafer including reference metrology data for at least one isolated structure on the wafer and reference metrology data for at least one nested structure on the wafer;
    creating an Iso/Nested control strategy including a first control plan for controlling a first etching process using the reference metrology data for the wafer;
    creating a second control plan for controlling a second etching process using the reference metrology data for the at least one nested structure on the wafer;
    calculating a measured bias trim using the difference between measured data for an isolated structure and measured data for a nested structure;
    determining a bias trim target;
    calculating a bias trim adjustment;
    determining the recipe settings to achieve the desired bias trim adjustment;
    computing the remaining BARC trim; and
    determining the recipe settings to achieve the desired BARC trim.

2. The method as claimed in claim 1, further comprising:
    obtaining measurement data for a plurality of isolated structures on a wafer, using Optical Digital Profileometry (ODP);
    obtaining Iso reference data for the plurality of isolated structures on the wafer using a Critical Dimension Scanning Electron Microscope (CD SEM); and
    establishing a first equation relating the Iso measurement data to the Iso reference data, the first equation having a first slope value and a first intercept value.

3. The method as claimed in claim 2, further comprising:
    obtaining nested measurement data for a plurality of nested structures on a wafer using ODP;
    obtaining nested reference data for the plurality of nested structures on the wafer using a CDSEM;
    establishing a second equation relating the nested measurement data to the nested reference data, the second equation having a second slope value and a second intercept value.

4. The method as claimed in claim 3, further comprising:
    obtaining a first measured value for an isolated structure;
    calculating a first correlated value for the isolated structure, wherein the first correlated value is equal to the first slope value times the first measured value plus the first intercept value;
    obtaining a second measured value for a nested structure;
    calculating a second correlated value for the nested structure, wherein the correlated value is equal to the second slope value times the second measured value plus the second intercept value; and
    determining the measured bias trim by calculating the difference between the first correlated value and the second correlated value.

5. The method as claimed in claim 4, wherein the first measured value is obtained by measuring a first grazing pattern on the wafer, which is associated with the isolated structure.

6. The method as claimed in claim 4, wherein the second measured value is obtained by measuring a second grating pattern on a wafer, which is associated with the nested structure.

7. The method as claimed in claim 3, further comprising:
    obtaining a first measured value for an isolated structure;
    calculating a first correlated value for the isolated structure, wherein the first correlated value is equal to the first slope value times the first measured value plus the first intercept value;
    obtaining a second measured value for a nested structure;

calculating a second correlated value for the nested structure, wherein the correlated value is equal to the second slope value times the second measured value plus the second intercept value; and
determining the measured bias trim using a value between the first correlated value and the second correlated value.

8. The method as claimed in claim 3, further comprising:
obtaining a first measured value for an isolated structure;
calculating a first correlated value for the isolated structure, wherein the first correlated value is equal to the first slope value times the first measured value plus the first intercept value;
obtaining a second measured value for a nested structure;
calculating a second correlated value for the nested structure, wherein the correlated value is equal to the second slope value times the second measured value plus the second intercept value; and
determining the measured bias trim by scaling the difference between the first correlated value and the second correlated value.

9. The method as claimed in claim 1, further comprising:
determining a bias trim target using historical data; and
calculating the bias trim adjustment by calculating the difference between the measured bias trim and the bias trim target value.

10. The method as claimed in claim 9, further comprising:
creating a process recipe to achieve the bias trim adjustment, wherein the process recipe comprise at least one control parameter; and
executing the process recipe to etch an amount approximately equal to the bias trim adjustment, wherein the at least one control parameter comprises a processing time.

11. The method as claimed in claim 10, wherein the at least one control parameter comprises a step time in a processing sequence.

12. A method of operating a semiconductor processing system comprising:
receiving, by the semiconductor processing system, input data comprising reference metrology data for a wafer including reference metrology data for at least one isolated structure on the wafer and reference metrology data for at least one nested structure on the wafer;
creating an Iso/Nested control strategy including a first control plan for controlling a first etching process using the reference metrology data for the wafer; and
creating a second control plan for controlling a second etching process using the reference metrology data for the at least one nested structure on the wafer;
obtaining measurement data for a plurality of control structures on a wafer, wherein the measurement data is obtained using Optical Digital Profilometry (ODP);
obtaining reference data for the plurality of intermediate control structures on the wafer wherein the measurement data is obtained using a Critical Dimension Scanning Electron Microscope (CD SEM); and
establishing a first equation relating the measurement data to the reference data, the first equation having a first slope value and a first intercept value.

13. A method of operating a semiconductor processing system comprising:
receiving, by the semiconductor processing system, input data comprising
reference metrology data for a wafer including reference metrology data for at least one isolated structure on the wafer and reference metrology data for at least one nested structure on the wafer;
creating an Iso/Nested control strategy including a first control plan for controlling a first etching process using the reference metrology data for the wafer; and
creating a second control plan for controlling a second etching process using the reference metrology data for the at least one nested structure on the wafer;
obtaining an intermediate measured value for a control structure;
calculating a first correlated value for the control structure, wherein the first correlated value is equal to the first slope value dines the intermediate measured value plus the first intercept value; and
determining a trim amount by calculating the difference between the first correlated value and a Critical Dimension (CD) target for the control structure.

14. The method as claimed in claim 13, wherein the intermediate measured value is obtained by measuring a first grating pattern on the wafer, which is associated with a control structure.

15. The method as claimed in claim 14, further comprising:
determining a value for a bias trim adjustment; and
determining a remaining trim amount, wherein the remaining trim amount is approximately equal to the first correlated value minus the bias trim adjustment amount and minus a final target value.

16. The method as claimed in claim 15, wherein the bias trim adjustment amount is determined using an average value for an etch rate times a step time.

17. The method as claimed in claim 15, further comprising:
creating a process recipe to achieve the remaining trim amount, wherein the process recipe comprise at least one control parameter; and
executing the process recipe to etch an amount approximately equal to the remaining trim amount, wherein the at least one control parameter comprises a process gas flow rate.

18. The method as claimed in claim 15, further comprising:
creating a process recipe to achieve the remaining trim amount, wherein the process recipe comprise at least one control parameter; and
executing the process recipe to etch an amount approximately equal to the remaining trim amount, wherein tie at least one control parameter comprises a process gas flow rate ratio.

19. A method of operating a semiconductor processing tool comprising:
creating, by the semiconductor processing tool, a plurality of iso/nested control strategies;
receiving a wafer, including at least one isolated structure;
determining an iso/nested control strategy to use for processing the wafer;
executing the determined iso/nested control strategy;
obtaining reference data;
obtaining measured data comprising isolated data, nested data, iso/nested data, or normal data, or a combination of two or more thereof,
creating correlated data by correlating the measured data to the reference data, the correlated data comprising correlated isolated data, correlated nested data, correlated iso/nested data, or correlated normal data, or a combination of two or more thereof;

obtaining a target value, wherein the target value comprises a bias target value;
calculating a trim amount, wherein the trim amount is a bias trim amount;
computing a first set of process parameters to achieve the calculated trim amount; and
creating a first process recipe using the first set of process parameters.

20. The method as claimed in claim 19, further comprising:
obtaining a final target value, wherein the final target value comprises a final CD target value;
calculating a remaining trim amount, wherein the remaining trim amount is a BARC trim amount;
computing a second set of process parameters to achieve the remaining trim amount; and
creating a second process recipe.

21. The method us claimed in claim 19, wherein computing the first set of process parameters comprises:
computing a first radio frequency (RF) power;
computing a first process gas flow rate; and
computing a first step time.

22. The method as claimed in claim 20, wherein computing the second set of process parameters comprises:
computing a second RF power;
computing a process gas flow rate; and
computing a second step time.

23. The method as claimed in claim 19, further comprising:
obtaining reference data;
obtaining measured isolated data;
obtaining measured nested data;
obtaining feedback data comprising a trim error value including a bias trim error value;
creating correlated isolated data by correlating the measured isolated data to the reference data;
creating correlated nested data by correlating the measured nested data to the reference data;
obtaining a target value, wherein the target value comprises a bias target value;
calculating a trim amount, wherein the trim amount is a bias trim amount;
computing a first set of recipe settings to achieve the calculated trim amount; and
creating a process recipe.

24. The method as claimed in claim 19, further comprising:
obtaining a final target value, wherein the final target value comprises a final CD target value;
calculating feedback data comprising a trim error value including a BARC trim error value;
calculating a remaining trim amount, wherein the remaining trim amount is a BARC trim amount;
computing a second set of process parameters to achieve the remaining trim amount; and
creating a second process recipe.

25. The method as claimed in claim 19, further comprising:
calculating feedback data comprising a trim error value including a bias trim error value; and
providing the feedback data to the first process recipe.

26. The method as claimed in claim 20, further comprising:
calculating feedback data comprising a trim error value including a BARC trim error value; and
providing the feedback data to the second process recipe.

27. The method as claimed in claim 19, further comprising:
obtaining reference data;
obtaining measured isolated data;
obtaining measured nested data;
creating correlated isolated data by correlating the measured isolated data to the reference data;
creating correlated nested data by correlating the measured nested data to the reference data;
obtaining a first desired process result including a target value, wherein the target value comprises a bias target value;
computing a first process error, wherein the first process error is a bias trim error amount, and
creating a process model, including an Iso/Nested model.

28. The method as claimed in claim 19, further comprising:
obtaining a final target value wherein the final target value comprises a final CD target value;
computing a second process error, wherein the second process error is a BARC trim error amount; and
creating a second process model, including a trim model based on the second process error.

29. The method as claimed in claim 19, further comprising:
obtaining reference data;
obtaining measured isolated data;
obtaining measured nested data;
creating correlated isolated data by correlating the measured isolated data to the reference data;
creating correlated nested data by correlating the measured nested data to the reference data;
obtaining a first desired process result including a target value, wherein the target value comprises a bias target value;
creating a first process model including an Iso/Nested model;
calculating a first expected process result including a trim amount, wherein the trim amount is a bias trim amount;
computing a first set of recipe settings to achieve the calculated trim amount; and
creating a process recipe.

30. The method as claimed in claim 29, further comprising:
obtaining a second desired process result including a second target value, wherein the second target value comprises a final CD target value;
obtaining a second process model including a trim model;
calculating a second expected process result including a second trim amount, wherein the second trim amount is a BARC trim amount;
computing a second set of process parameters to achieve the remaining trim amount; and
creating a process recipe.

31. The method as claimed in claim 29, further comprising:
obtaining measured control data;
creating correlated control data by correlating the measured control data to the reference data;
obtaining the trim amount;
obtaining a second desired process result including a second target value, wherein the second target value comprises a final CD target value;
obtaining a second process model including a trim model;
calculating a second expected process result including a second trim amount, wherein the second trim amount is a BARC trim amount;

computing a second set of process parameters to achieve the remaining trim amount; and creating a process recipe.

32. The method as claimed in claim 29, further comprising:

computing virtual measurement data;

obtaining a second desired process result including a second target value, wherein the second target value comprises a final CD target value;

obtaining a second process model including a trim model;

calculating a second expected process result including a second trim amount, wherein the second trim amount is a BARC trim amount.

33. The method, as claimed in claim 19, wherein the isolated structure comprises a via, a trench, or a stack, or a combination of two or more thereof.

34. A method of operating a semiconductor processing tool comprising;

creating, by the semiconductor processing tool, a plurality of iso/nested control strategies;

receiving a wafer, including at least one isolated structure;

determining an iso/nested control strategy to use for processing the wafer;

executing the determined iso/nested control strategy;

obtaining process model state data;

obtaining measured data comprising isolated data, nested data, iso/nested data, or normal data, or a combination of two or more thereof;

creating correlated data by correlating the measured data to the process model state data, the correlated data comprising correlated isolated data, correlated nested data, correlated iso/nested data, or correlated normal data, or a combination of two or more thereof, obtaining a target value, wherein the target value comprises a bias target value;

calculating a trim amount, wherein the trim amount is a bias trim amount;

computing a first set of process parameters to achieve the calculated trim amount; and creating a first process recipe using the first set of process parameters.

35. The method as claimed in claim 34, further comprising:

obtaining a final target value, wherein the final target nine comprises a final CD target value;

calculating a remaining trim amount, wherein the remaining trim amount is a BARC trim amount;

computing a second set of process parameters to achieve the remaining trim amount; and creating a second process recipe.

36. A method of operating a semiconductor processing system, comprising:

obtaining reference data;

obtaining measured data comprising isolated data, nested data, iso/nested data, or normal data, or a combination of two or more thereof;

creating correlated data by correlating the measured data to the reference data, the correlated data comprising correlated isolated data, correlated nested data, correlated iso/nested data, or correlated normal data, or a combination of two or mare thereof, obtaining a first desired process result including a first target value, wherein the first target value comprises a bias target value;

calculating a first expected process result including a trim amount, wherein the trim amount is a bias trim amount;

obtaining a second desired process result including a second target value, wherein the second target value comprises a BARC trim target value;

calculating a second expected process result including a second trim amount, wherein the second trim amount comprises a BARC trim amount;

computing a first set of recipe settings to achieve the calculated trim amount; and creating a process recipe.

* * * * *